United States Patent
Kim et al.

(10) Patent No.: US 10,186,568 B2
(45) Date of Patent: Jan. 22, 2019

(54) ORGANIC LIGHT EMITTING DISPLAY APPARATUS AND METHOD OF MANUFACTURING THE SAME

(71) Applicant: LG DISPLAY CO., LTD., Seoul (KR)

(72) Inventors: SeJune Kim, Paju-si (KR); Joonsuk Lee, Seoul (KR); SoJung Lee, Paju-si (KR); Jin-Hee Jang, Seoul (KR); Jonghyeok Im, Busan (KR); JaeSung Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 44 days.

(21) Appl. No.: 14/985,026

(22) Filed: Dec. 30, 2015

(65) Prior Publication Data

US 2016/0351652 A1 Dec. 1, 2016

(30) Foreign Application Priority Data

May 28, 2015 (KR) ........................ 10-2015-0075395

(51) Int. Cl.
| | |
|---|---|
| *H01L 27/32* | (2006.01) |
| *H01L 51/05* | (2006.01) |
| *H01L 51/52* | (2006.01) |
| *H01L 51/56* | (2006.01) |

(52) U.S. Cl.
CPC ...... *H01L 27/3279* (2013.01); *H01L 27/3246* (2013.01); *H01L 27/3248* (2013.01); *H01L 27/3258* (2013.01); *H01L 27/3276* (2013.01); *H01L 51/0541* (2013.01); *H01L 51/5228* (2013.01); *H01L 51/5237* (2013.01); *H01L 51/5218* (2013.01); *H01L 51/56* (2013.01); *H01L 2227/323* (2013.01); *H01L 2251/5315* (2013.01)

(58) Field of Classification Search
None
See application file for complete search history.

(56) References Cited

U.S. PATENT DOCUMENTS

| | | | |
|---|---|---|---|
| 8,404,509 B2* | 3/2013 | Park | H01L 27/1214 257/E21.053 |
| 8,569,742 B2* | 10/2013 | Ohsawa | H01L 27/3274 257/40 |
| 2005/0110023 A1 | 5/2005 | Lee et al. | |
| 2007/0075313 A1 | 4/2007 | Kwak et al. | |
| 2013/0056784 A1 | 3/2013 | Lee et al. | |
| 2013/0277668 A1 | 10/2013 | Yoo et al. | |

(Continued)

FOREIGN PATENT DOCUMENTS

EP 2 657 969 A2 10/2013

*Primary Examiner* — Phat X Cao
*Assistant Examiner* — Diana C Vieira
(74) *Attorney, Agent, or Firm* — Birch, Stewart, Kolasch & Birch, LLP

(57) ABSTRACT

An organic light emitting display device includes a thin film transistor (TFT) including a gate electrode and a source electrode. An anode electrode is disposed on the TFT, and a cathode electrode disposed on an organic emission layer is connected to an auxiliary electrode which is disposed on a same layer on which the anode electrode is disposed. A signal pad disposed in a pad area of a substrate is disposed on a same layer on which the gate electrode is disposed in an active area of the substrate. A pad electrode disposed on the signal pad is connected to the signal pad through a contact hole.

17 Claims, 14 Drawing Sheets

(56) References Cited

U.S. PATENT DOCUMENTS

2014/0159002 A1* 6/2014 Lee .................... H01L 27/3246
　　　　　　　　　　　　　　　　　　　　　　257/40
2014/0339537 A1* 11/2014 Bae ................... H01L 29/78636
　　　　　　　　　　　　　　　　　　　　　　257/43
2014/0346448 A1　11/2014 You et al.

* cited by examiner

ORGANIC LIGHT EMITTING DISPLAY APPARATUS AND METHOD OF MANUFACTURING THE SAME

CROSS-REFERENCE TO RELATED APPLICATIONS

This application claims the priority benefit of the Korean Patent Application No. 10-2015-0075395 filed on May 28, 2015, which is hereby incorporated by reference as if fully set forth herein.

BACKGROUND OF THE INVENTION

Field of the Invention

The present invention relates to an organic light emitting display apparatus, and more particularly, to a top emission type organic light emitting display apparatus and a method of manufacturing the same.

Discussion of the Related Art

Organic light emitting display apparatuses are self-emitting apparatuses and have a low power consumption, a fast response time, high emission efficiency, high luminance, and a wide viewing angle.

The organic light emitting display apparatuses are classified into a top emission type and a bottom emission type, based on a transmission direction of light emitted from an organic light emitting element. In the bottom emission type, a circuit element is disposed between an emission layer and an image displaying surface, and for this reason, an aperture ratio is lowered. On the other hand, in the top emission type, the circuit element is not disposed between the emission layer and the image displaying surface, and thus, an aperture ratio is enhanced.

FIG. 1 is a schematic cross-sectional view of a related art top emission type organic light emitting display apparatus.

As seen in FIG. 1, a thin film transistor (TFT) layer T which includes an active layer 11, a gate insulation layer 12, a gate electrode 13, an interlayer dielectric 14, a source electrode 15, and a drain electrode 16 is formed in an active area AA on a substrate 10, and a passivation layer 20 and a planarization layer 30 are sequentially formed on the TFT layer T.

An anode electrode 40 and an auxiliary electrode 50 are formed on the planarization layer 30. The auxiliary electrode 50 decreases a resistance of a cathode electrode 80 to be described below.

A bank 60 is formed on the anode electrode 40 and the auxiliary electrode 50 and defines a pixel area. An organic emission layer 70 is formed in the pixel area defined by the bank 60, and the cathode electrode 80 is formed on the organic emission layer 70.

In the top emission type, light emitted from the organic emission layer 70 passes through the cathode electrode 80. Therefore, the cathode electrode 80 is formed of a transparent conductive material, and a resistance of the cathode electrode 80 increases. In order to decrease the resistance of the cathode electrode 80, the cathode electrode 80 is connected to the auxiliary electrode 50.

The gate insulation layer 12 and the interlayer dielectric 14 are formed in a pad area PA on the substrate 10, a signal pad 90 is formed on the interlayer dielectric 14, and the passivation layer 20 is formed on the signal pad 90. A hole is provided in the passivation layer 20, and the signal pad 90 is exposed to the outside through the hole. Since the signal pad 90 should be connected to an external driving circuit, the signal pad 90 is exposed to the outside by forming the hole in the passivation layer 20.

The related art top emission type organic light emitting display apparatus has the following problems.

Since the signal pad 90 should be connected to the external driving circuit, a top of the signal pad 90 is exposed to the outside. For this reason, the top of the signal pad 90 is corroded, and the corrosion is spread to another area.

A metal layer which is excellent in corrosion resistance may be further formed on the top of the signal pad 90 so as to prevent the top of the signal pad 90 from being corroded, but in this case, the number of process steps increases. Also, an electrode layer like the anode electrode 40 may be formed on the signal pad 90 through the same process so as to prevent the top of the signal pad 90 from being corroded without an increase in the number of process steps. Even in this case, however, it is unable to prevent the electrode layer formed on the top of the signal pad 90 from being corroded, or it is unable to prevent corrosion from being spread through a side surface of the electrode layer.

Moreover, in order to connect the signal pad 90 to the external driving circuit, the top of the signal pad 90 is exposed by forming a contact hole in the passivation layer 20, but when the contact hole of the passivation layer 20 is previously formed, an etchant for pattern-forming the anode electrode 40 flows through the contact hole and damages the signal pad 90.

SUMMARY OF THE INVENTION

Accordingly, the present invention is directed to an organic light emitting display apparatus and a method of manufacturing the same that substantially obviate one or more problems due to limitations and disadvantages of the related art.

An aspect of the present invention is directed to a top emission type organic light emitting display apparatus and a method of manufacturing the same, in which the number of additional processes is minimized, and a signal pad is prevented from being corroded and is prevented from being damaged by an etchant.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display apparatus in which a thin film transistor (TFT) including a gate electrode and a source electrode, an anode electrode, an organic emission layer, a cathode electrode, an auxiliary electrode disposed on the same layer as that of the anode electrode to be connected to the cathode electrode are disposed in an active area of a substrate, a signal pad provided on the same layer as that of the gate electrode and a pad electrode connected to the signal pad through a contact hole are disposed in a pad area of the substrate, and the pad electrode is disposed on the same layer as that of the source electrode.

In another aspect of the present invention, there is provided a method of manufacturing an organic light emitting display apparatus including: forming a gate electrode and a signal pad on a substrate; forming an interlayer dielectric on the gate electrode and the signal pad and forming a source electrode and a pad electrode on the interlayer dielectric; forming a passivation layer on the source electrode and the pad electrode; forming an anode electrode and auxiliary electrode separated from the anode electrode on the passivation layer; and removing at least a portion of the passivation layer formed on the pad electrode, for externally exposing the pad electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
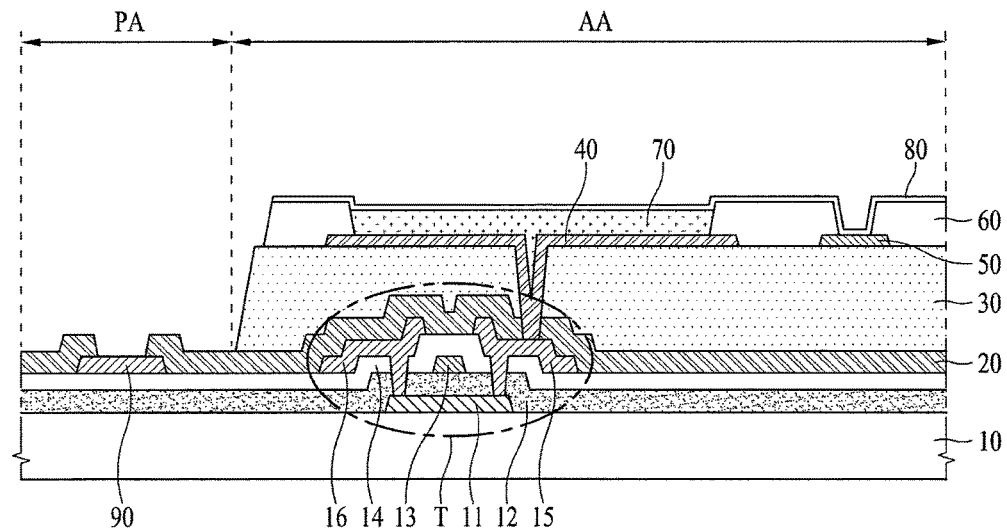
FIG. 1 is a schematic cross-sectional view of a related art top emission type organic light emitting display apparatus.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, exemplary embodiments of the present invention will be described in detail with reference to the accompanying drawings.

Figure 2:
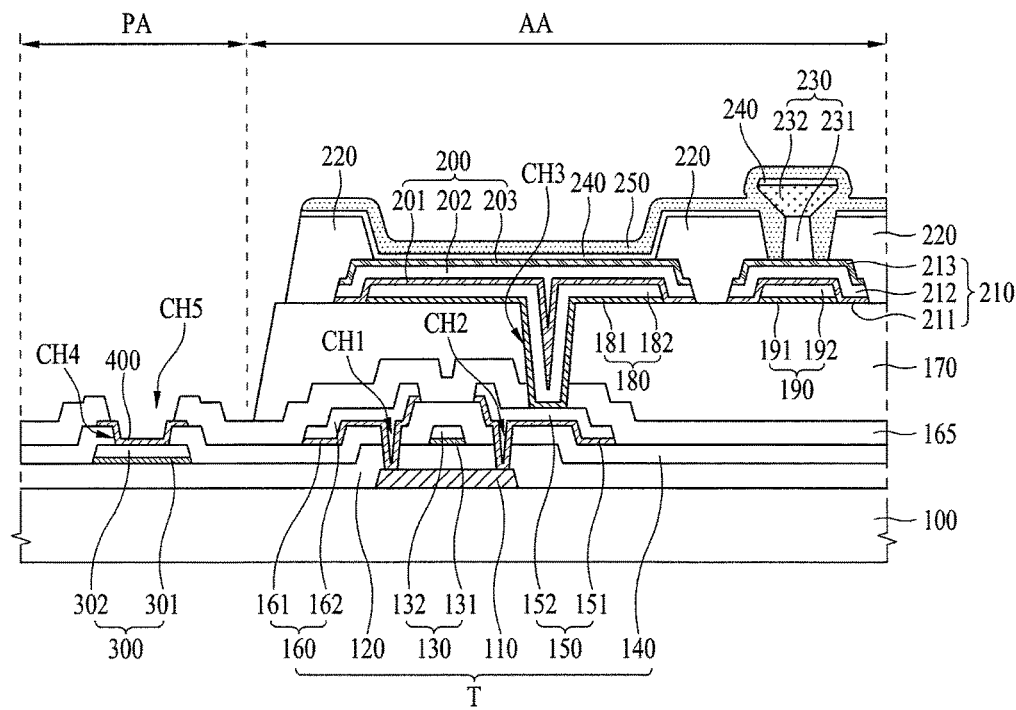
FIG. 2 is a cross-sectional view of an organic light emitting display apparatus according to an embodiment of the present invention.

FIG. 2 is a cross-sectional view of an organic light emitting display apparatus according to an embodiment of the present invention.

As seen in FIG. 2, the organic light emitting display apparatus according to an embodiment of the present invention may include an active area AA and a pad area PA which are included in a substrate 100.

A thin film transistor (TFT) T, a passivation layer 165, a planarization layer 170, a first anode electrode 180, a second anode electrode 200, a first auxiliary electrode 190, a second auxiliary electrode 210, a bank 220, a partition wall 230, an organic emission layer 240, and a cathode electrode 250 may be formed in the active area AA of the substrate 100.

The TFT T may include an active layer 110, a gate insulation layer 120, a gate electrode 130, an interlayer dielectric 140, a source electrode 150, and a drain electrode 160.

The active layer 110 may be formed on the substrate 100 to overlap the gate electrode 130. The active layer 110 may be formed of a silicon-based semiconductor material, or may be formed of an oxide-based semiconductor material. Although not shown, a light shielding layer may be further formed between the substrate 100 and the active layer 110, and in this case, external light incident through a bottom of the substrate 100 is blocked by the light shielding layer, thereby preventing the active layer 110 from being damaged by the external light.

The gate insulation layer 120 may be formed on the active layer 110. The gate insulation layer 120 may insulate the active layer 110 from the gate electrode 130. The gate insulation layer 120 may be formed of an inorganic insulating material, for example, silicon oxide (SiOx), silicon nitride (SiNx), or a multilayer thereof, but is not limited thereto. The gate insulation layer 120 may extend to the pad area PA.

The gate electrode 130 may be formed on the gate insulation layer 120. The gate electrode 130 may be formed to overlap the active layer 110 with the gate insulation layer 120 therebetween.

The gate electrode 130 may include a lower gate electrode 131 and an upper gate electrode 132.

The lower gate electrode 131 may be formed between the gate insulation layer 120 and the upper gate electrode 132 and may enhance an adhesive force between the gate insulation layer 120 and the upper gate electrode 132. Also, the lower gate electrode 131 protects a bottom of the upper gate electrode 132, thereby preventing the bottom of the upper gate electrode 132 from being corroded. Therefore, an oxidation rate of the lower gate electrode 131 may be lower than that of the upper gate electrode 132. That is, the lower gate electrode 131 may be formed of a material which is stronger in corrosion resistance than a material forming the upper gate electrode 132. As described above, the lower gate electrode 131 may act as an adhesion enhancement layer or an anti-corrosion layer and may be formed of an alloy (MoTi) of molybdenum (Mo) and titanium (Ti), but is not limited thereto.

The upper gate electrode 132 may be formed on a top of the lower gate electrode 131. The upper gate electrode 132 may be formed of copper (Cu) which is metal having a low resistance, but is not limited thereto. The upper gate electrode 132 may be formed of metal which is relatively lower in resistance than the lower gate electrode 131. In order to lower a total resistance of the gate electrode 130, a thickness of the upper gate electrode 132 may be formed thicker than that of the lower gate electrode 131.

The interlayer dielectric 140 may be formed on the gate electrode 130. The interlayer dielectric 140 may be formed of the same inorganic insulating material as that of the gate insulation layer 120, for example, silicon oxide (SiOx), silicon nitride (SiNx), or a multilayer thereof, but is not limited thereto. The interlayer dielectric 140 may extend to the pad area PA.

The source electrode 150 and the drain electrode 160 may be formed to face each other on the interlayer dielectric 140. A first contact hole CH1 exposing one end region of the active layer 110 and a second contact hole CH2 exposing the other end region of the active layer 110 may be included in the gate insulation layer 120 and the interlayer dielectric 140. The source electrode 150 may be connected to the other end region of the active layer 110 through the second contact hole CH2, and the drain electrode 160 may be connected to the one end region of the active layer 110 through the first contact hole CH1.

The source electrode 150 may be formed of a multilayer which includes a lower source electrode 151 and an upper source electrode 152.

The lower source electrode 151 may be formed between the interlayer dielectric 140 and the upper source electrode 152 and may enhance an adhesive force between the interlayer dielectric 140 and the upper source electrode 152. Also, the lower source electrode 151 protects a bottom of the upper source electrode 152, thereby preventing the bottom of the upper source electrode 152 from being corroded. Therefore, an oxidation rate of the lower source electrode 151 may be lower than that of the upper source electrode 152. That is, the lower source electrode 151 may be formed of a material which is stronger in corrosion resistance than a material forming the upper source electrode 152. As described above, the lower source electrode 151 may act as an adhesion enhancement layer or an anti-corrosion layer and may be formed of an alloy (MoTi) of Mo and Ti, but is not limited thereto.

The upper source electrode 152 may be formed on a top of the lower source electrode 151. The upper source electrode 152 may be formed of copper (Cu) which is metal having a low resistance, but is not limited thereto. The upper source electrode 152 may be formed of metal which is relatively lower in resistance than the lower source electrode 151. In order to lower a total resistance of the source electrode 150, a thickness of the upper source electrode 152 may be formed thicker than that of the lower source electrode 151.

Similarly to the above-described source electrode 150, the drain electrode 160 may be formed in a multilayer which includes a lower drain electrode 161 and an upper drain electrode 162.

The lower drain electrode 161 may be formed between the interlayer dielectric 140 and the upper drain electrode 162. The lower drain electrode 161 enhances an adhesive force between the interlayer dielectric 140 and the upper drain electrode 162 and moreover prevents a bottom of the upper drain electrode 162 from being corroded. Therefore, an oxidation rate of the lower drain electrode 161 may be lower than that of the upper drain electrode 162. That is, the lower drain electrode 161 may be formed of a material which is stronger in corrosion resistance than a material forming the upper drain electrode 162. As described above, the lower drain electrode 161 may be formed of an alloy (MoTi) of Mo and Ti which is the same as the above-described material of the lower source electrode 151, but is not limited thereto.

The upper drain electrode 162 may be formed on a top of the lower drain electrode 161 and may be formed of copper (Cu) which is the same as the above-described material of the upper source electrode 152, but is not limited thereto. A thickness of the upper drain electrode 162 may be formed thicker than that of the lower drain electrode 161, thereby lowering a total resistance of the drain electrode 160.

The upper drain electrode 162 may be formed of the same material as that of the upper source electrode 152 to have the same thickness as that of the upper source electrode 152, and the lower drain electrode 161 may be formed of the same material as that of the lower source electrode 151 to have the same thickness as that of the lower source electrode 151. In this case, the drain electrode 160 and the source electrode 150 may be simultaneously formed through the same process.

A structure of the TFT T is not limited to the illustrated structure, and may be variously modified to structures known to those skilled in the art. For example, a top gate structure where the gate electrode 130 is formed on the active layer 110 is illustrated in the drawing, but the TFT T may be formed in a bottom gate structure where the gate electrode 130 is formed under the active layer 110.

The passivation layer 165 may be formed on the TFT T, and in more detail, may be formed on tops of the source electrode 150 and the drain electrode 160. The passivation layer 165 protects the TFT T. The passivation layer 165 may be formed of an inorganic insulating material (for example, SiOx and SiNx), but is not limited thereto. The passivation layer 165 may extend to the pad area PA.

The planarization layer 170 may be formed on the passivation layer 165. The planarization layer 170 may planarize an upper surface of the substrate 100 including the TFT T. The planarization layer 170 may be formed of an organic insulating material such as acryl resin, epoxy resin, phenolic resin, polyamide resin, polyimide resin, or the like, but is not limited thereto. The planarization layer 170 may not extend to the pad area PA.

The first anode electrode 180 and the first auxiliary electrode 190 may be formed on the planarization layer 170. That is, the first anode electrode 180 and the first auxiliary electrode 190 may be formed on the same layer. A third contact hole CH3 exposing the source electrode 150 may be included in the passivation layer 165 and the planarization layer 170, and the source electrode 150 may be connected to the first anode electrode 180 through the third contact hole CH3. In one or more embodiments, the first anode electrode 180 is connected with the source electrode 150. However, the source electrode 150 and the drain electrode 160 can be switched based on the mode of the transistor. Accordingly, in one or more embodiments, the first anode electrode 180 may be connected with the drain electrode 160 instead of the source electrode 150. As a result, the first anode electrode 180 may be connected with the source electrode 150 or the drain electrode 160.

The first anode electrode 180 may include a first lower anode electrode 181 and a first upper anode electrode 182.

The first lower anode electrode 181 may be formed between the planarization layer 170 and the first upper anode electrode 182 and may enhance an adhesive force between the planarization layer 170 and the first upper anode electrode 182. Also, the first lower anode electrode 181 protects a bottom of the first upper anode electrode 182, thereby preventing the bottom of the first upper anode electrode 182 from being corroded. Therefore, an oxidation rate of the first lower anode electrode 181 may be lower than that of the first upper anode electrode 182. That is, the first lower anode electrode 181 may be formed of a material which is stronger in corrosion resistance than a material forming the first upper anode electrode 182. Also, the first upper anode electrode 181 protects a top of the upper source electrode 152, thereby preventing the top of the upper source electrode 152 from being corroded. Therefore, an oxidation rate of the first lower anode electrode 181 may be lower than that of the upper source electrode 152. That is, the first lower anode electrode 181 may be formed of a material which is stronger in corrosion resistance than a material forming the upper source electrode 152. As described above, the first lower anode electrode 181 prevents the top of the upper source electrode 152 from being corroded, and thus, the source electrode 150 may be formed in the above-described two-layer structure. The first lower anode electrode 181 may act as an adhesion enhancement layer or an anti-corrosion layer and may be formed of an alloy (MoTi) of Mo and Ti, but is not limited thereto.

The first upper anode electrode 182 may be formed on a top of the first lower anode electrode 181. The first upper anode electrode 182 may be formed of copper (Cu) which is metal having a low resistance, but is not limited thereto. The first upper anode electrode 182 may be formed of metal which is relatively lower in resistance than the first lower anode electrode 181. In order to lower a total resistance of the first anode electrode 180, a thickness of the first upper anode electrode 182 may be formed thicker than that of the first lower anode electrode 181.

Similarly to the above-described first anode electrode 180, the first auxiliary electrode 190 may include a first lower auxiliary electrode 191 and a first upper auxiliary electrode 192.

The first lower auxiliary electrode 191 may be formed between the planarization layer 170 and the first upper auxiliary electrode 192. The first lower auxiliary electrode 191 enhances an adhesive force between the planarization layer 170 and the first upper auxiliary electrode 192 and moreover prevents a bottom of the first upper auxiliary electrode 192 from being corroded. Therefore, an oxidation rate of the first lower auxiliary electrode 191 may be lower than that of the first upper auxiliary electrode 192. That is, the first lower auxiliary electrode 191 may be formed of a material which is stronger in corrosion resistance than a material forming the first upper auxiliary electrode 192. As described above, the first lower auxiliary electrode 191 may be formed of an alloy (MoTi) of Mo and Ti which is the same as the above-described material of the first lower anode electrode 181, but is not limited thereto.

The first upper auxiliary electrode 192 may be formed on a top of the first lower auxiliary electrode 191 and may be formed of copper (Cu) which is the same as the above-described material of the first upper anode electrode 182, but is not limited thereto. The first upper auxiliary electrode 192 may be formed of metal which is relatively lower in resistance than the first lower auxiliary electrode 191. A thickness of the first upper auxiliary electrode 192 which is relatively low in resistance may be formed thicker than that of the first lower auxiliary electrode 191 which is relatively high in resistance, thereby lowering a total resistance of the first auxiliary electrode 190.

The first upper auxiliary electrode 192 may be formed of the same material as that of the first upper anode electrode 182 to have the same thickness as that of the first upper anode electrode 182, and the first lower auxiliary electrode 191 may be formed of the same material as that of the first lower anode electrode 181 to have the same thickness as that of the first lower anode electrode 181. In this case, the first auxiliary electrode 190 and the first anode electrode 180 may be simultaneously formed through the same process.

The second anode electrode 200 may be formed on a top of the first anode electrode 180. The second anode electrode 200 may be formed to contact a whole top and side surface of the first anode electrode 180. That is, a separate insulation layer may not be formed (e.g. may be omitted) between the second anode electrode 200 and the first anode electrode 180, and thus, a process of forming an insulation layer and a contact hole is not needed. The second anode electrode 200 may reflect light, emitted from the organic emission layer 240, in an upward direction, and to this end, the second anode electrode 200 may be formed of a material having good reflectivity. Also, the second anode electrode 200 may be formed to cover the top and side surface of the first anode electrode 180 and prevents the top and side surface of the first anode electrode 180 from being corroded.

The second anode electrode 200 may include a second lower anode electrode 201, a second center anode electrode 202, and a second upper anode electrode 203.

The second lower anode electrode 201 may be formed between the first anode electrode 180 and the second center anode electrode 202. The second lower anode electrode 201 may be formed to cover a top and a side surface of the first anode electrode 180, thereby preventing the first anode electrode 180 from being corroded. To this end, an oxidation rate of the second lower anode electrode 201 may be lower than that of each of the first lower anode electrode 181 and the first upper anode electrode 182 which configure the first anode electrode 180. That is, the second lower anode electrode 201 may be formed of a material which is stronger in corrosion resistance than a material forming the first lower anode electrode 181 and the first upper anode electrode 182. Also, the second lower anode electrode 201 protects a bottom of the second center anode electrode 202, thereby preventing the bottom of the second center anode electrode 202 from being corroded. To this end, an oxidation rate of the second lower anode electrode 201 may be lower than that of the second center anode electrode 202. That is, the second lower anode electrode 201 may be formed of a material which is stronger in corrosion resistance than a material forming the second center anode electrode 202. The second lower anode electrode 201 may be formed of a transparent conductive material such as indium tin oxide (ITO) or the like, but is not limited thereto.

The second center anode electrode 202 may be formed between the second lower anode electrode 201 and the second upper anode electrode 203. The second center anode electrode 202 may be formed of a material which is lower in resistance than and better in reflectivity than the second lower anode electrode 201 and the second upper anode electrode 203, and for example, may be formed of silver (Ag). However, the present embodiment is not limited thereto. A thickness of the second center anode electrode 202 which is relatively low in resistance may be formed thicker than that of each of the second lower anode electrode 201 and the second upper anode electrode 203 which are relatively high in resistance, thereby lowering a total resistance of the second anode electrode 200.

The second upper anode electrode 203 may be formed on a top of the second center anode electrode 202, thereby preventing the top of the second center anode electrode 202 from being corroded. To this end, an oxidation rate of the second upper anode electrode 203 may be lower than that of the second center anode electrode 202. That is, the second upper anode electrode 203 may be formed of a material which is stronger in corrosion resistance than a material forming the second center anode electrode 202. The second upper anode electrode 203 may be formed of a transparent conductive material such as ITO or the like, but is not limited thereto.

The second auxiliary electrode 210 may be formed on a top of the first auxiliary electrode 190. The second auxiliary electrode 210 may be formed on the same layer on which the second anode electrode 200 is disposed. The second auxiliary electrode 210 may be formed to contact a whole top and side surface of the first auxiliary electrode 190. That is, a separate insulation layer may not be formed (e.g. may be omitted) between the second auxiliary electrode 210 and the first auxiliary electrode 190, and thus, a process of forming an insulation layer and a contact hole is not needed. The second auxiliary electrode 210 functions to lower a resistance of the cathode electrode 250 along with the first auxiliary electrode 190. According to an embodiment of the present invention, two auxiliary electrodes (for example, the first and second auxiliary electrodes 190 and 210) may be stack-formed for lowering the resistance of the cathode electrode 250, and thus, the desired resistance characteristic of the auxiliary electrodes is more easily adjusted. Also, the second auxiliary electrode 210 may be formed to cover the top and side surface of the first auxiliary electrode 190, thereby preventing the top and side surface of the first auxiliary electrode 190 from being corroded.

The second auxiliary electrode 210 may include a second lower auxiliary electrode 211, a second center auxiliary electrode 212, and a second upper auxiliary electrode 213.

The second lower auxiliary electrode 211 may be formed between the first auxiliary electrode 190 and the second center auxiliary electrode 212. The second lower auxiliary electrode 211 may be formed to cover a top and a side surface of the first auxiliary electrode 190, thereby preventing the first auxiliary electrode 190 from being corroded. To this end, an oxidation rate of the second lower auxiliary electrode 211 may be lower than that of each of the first lower auxiliary electrode 191 and the first upper auxiliary electrode 192 which configure the first auxiliary electrode 190. That is, the second lower auxiliary electrode 211 may be formed of a material which is stronger in corrosion resistance than a material forming the first lower auxiliary electrode 191 and the first upper auxiliary electrode 192. Also, the second lower auxiliary electrode 211 protects a bottom of the second center auxiliary electrode 212, thereby preventing the bottom of the second center auxiliary electrode 212 from being corroded. To this end, an oxidation rate of the second lower auxiliary electrode 211 may be lower than that of the second center auxiliary electrode 212. That is, the second lower auxiliary electrode 211 may be formed of a material which is stronger in corrosion resistance than a material forming the second center auxiliary electrode 212. The second lower auxiliary electrode 211 may be formed of a transparent conductive material such as ITO or the like, but is not limited thereto.

The second center auxiliary electrode 212 may be formed between the second lower auxiliary electrode 211 and the second upper auxiliary electrode 213. The second center auxiliary electrode 212 may be formed of a material which is lower in resistance and better in reflectivity than the second lower auxiliary electrode 211 and the second upper auxiliary electrode 213, and for example, may be formed of silver (Ag). However, the present embodiment is not limited thereto. A thickness of the second center auxiliary electrode 212 which is relatively low in resistance may be formed thicker than that of each of the second lower auxiliary electrode 211 and the second upper auxiliary electrode 213 which are relatively high in resistance, thereby lowering a total resistance of the second auxiliary electrode 210.

The second upper auxiliary electrode 213 may be formed on a top of the second center auxiliary electrode 212, thereby preventing the top of the second center auxiliary electrode 212 from being corroded. To this end, an oxidation rate of the second upper auxiliary electrode 213 may be lower than that of the second center auxiliary electrode 212. That is, the second upper auxiliary electrode 213 may be formed of a material which is stronger in corrosion resistance than a material forming the second center auxiliary electrode 212. The second upper auxiliary electrode 213 may be formed of a transparent conductive material such as ITO or the like, but is not limited thereto.

The second upper auxiliary electrode 213 may be formed of the same material as that of the second upper anode electrode 203 to have the same thickness as that of the second upper anode electrode 203, the second center auxiliary electrode 212 may be formed of the same material as that of the second center anode electrode 202 to have the same thickness as that of the second center anode electrode 202, and the second lower auxiliary electrode 211 may be formed of the same material as that of the second lower anode electrode 201 to have the same thickness as that of the second lower anode electrode 201. In this case, the second auxiliary electrode 210 and the second anode electrode 200 may be simultaneously formed through the same process.

The bank 220 may be formed on the second anode electrode 200 and the second auxiliary electrode 210.

The bank 220 may be formed on one side and the other side of the second anode electrode 200 to expose a top of the second anode electrode 200. Since the bank 220 is formed to expose the top of the second anode electrode 200, an area where an image is displayed is secured. Also, since the bank 220 is formed on the one side and the other side of the second anode electrode 200, a side surface of the second center anode electrode 202 vulnerable to corrosion is prevented from being exposed to the outside, thereby preventing the side surface of the second center anode electrode 202 from being corroded.

The bank 220 may be formed on one side and the other side of the second auxiliary electrode 210 to expose a top of the second auxiliary electrode 210. Since the bank 220 is formed to expose the top of the second auxiliary electrode 210, an electrical connection space between the second auxiliary electrode 210 and the cathode electrode 250 is secured. Also, since the bank 220 is formed on the one side and the other side of the second auxiliary electrode 210, a side surface of the second center auxiliary electrode 212 vulnerable to corrosion is prevented from being exposed to the outside, thereby preventing the side surface of the second center auxiliary electrode 212 from being corroded.

Moreover, the bank 220 may be formed between the second anode electrode 200 and the second auxiliary electrode 210 and may insulate the second anode electrode 200 from the second auxiliary electrode 210. The bank 220 may be formed of an organic insulating material such as polyimide resin, acryl resin, benzocyclobutene (BCB), or the like, but is not limited thereto.

The partition wall 230 may be formed on the second auxiliary electrode 210. The partition wall 230 may be separated from the bank 220 by a certain distance, and the second auxiliary electrode 210 may be electrically connected to the cathode electrode 250 through a separation space between the partition wall 230 and the bank 220. The second auxiliary electrode 210 may be electrically connected to the cathode electrode 250 without forming the partition wall 230. However, if the partition wall 230 is formed, the organic emission layer 240 can be more easily formed by deposition. This will be described below in more detail.

If the partition wall 230 is not formed, a mask pattern which covers a top of the second auxiliary electrode 210 is needed in depositing the organic emission layer 240, in order for the top of the second auxiliary electrode 210 not to be covered by the organic emission layer 240. However, if the partition wall 230 is formed, a top of the partition wall 230 may act as eaves in depositing the organic emission layer 240, and thus, since the organic emission layer 240 is not deposited under the eaves, the mask pattern which covers the top of the second auxiliary electrode 210 is not needed. That is, with respect to a case where the organic light emitting display apparatus is seen from the front thereof, when a width of the top of the partition wall 230 that acts as eaves is greater than a separation width between the partition wall 230 and the bank 220, namely, when the top of the partition wall 230 is formed to cover a separation space between the partition wall 230 and the bank 220, the organic emission layer 240 cannot penetrate into the separation space between the partition wall 230 and the bank 220, and thus, the second auxiliary electrode 210 may be exposed in the separation space between the partition wall 230 and the bank 220. Particularly, the organic emission layer 240 may be formed by a deposition process such as an evaporation process which is excellent in straightness of a deposited material, and thus, the organic emission layer 240 is not deposited in the separation space between the partition wall 230 and the bank 220.

As described above, a width of the top of the partition wall 230 may be formed greater than that of a bottom of the partition wall 230, in order for the top of the partition wall 230 to act as eaves. The partition wall 230 may include a lower first partition wall 231 and an upper second partition wall 232. The first partition wall 231 may be formed on a top of the second auxiliary electrode 210 and may be formed of the same material as that of the bank 220 through the same process as that of the bank 220. The second partition wall 232 may be formed on a top of the first partition wall 231. A width of a top of the second partition wall 232 may be formed greater than that of a bottom of the second partition wall 232, and particularly, since the width of the top of the second partition wall 232 is greater than the separation width between the partition wall 230 and the bank 220, the top of the second partition wall 232 may act as eaves.

The organic emission layer 240 may be formed on the second anode electrode 200. The organic emission layer 240 may include a hole injection layer, a hole transport layer, an emission layer, an electron transport layer, and an electron injection layer. The organic emission layer 240 may be modified to have various structures known to those skilled in the art.

The organic emission layer 240 may extend to the top of the bank 220. However, the organic emission layer 240 may not extend to the top of the second auxiliary electrode 210 in a state of covering the top of the second auxiliary electrode 210. This is because when the organic emission layer 240 covers the top of the second auxiliary electrode 210, it is difficult to electrically connect the second auxiliary electrode 210 to the cathode electrode 250. As described above, the organic emission layer 240 may be formed by a deposition process without a mask that covers the top of the second auxiliary electrode 210, and in this case, the organic emission layer 240 may be formed on the top of the partition wall 230.

The cathode electrode 250 may be formed on the organic emission layer 240. The cathode electrode 250 may be formed on a surface from which light is emitted, and thus may be formed of a transparent conductive material. Since the cathode electrode 250 is formed of a transparent conductive material, a resistance of the cathode electrode 250 is high, and for this reason, in order to lower the resistance of the cathode electrode 250, the cathode electrode 250 may be connected to the second auxiliary electrode 210. That is, the cathode electrode 250 may be connected to the second auxiliary electrode 210 through the separation space between the partition wall 230 and the bank 220. The cathode electrode 250 may be formed by a deposition process such as a sputtering process which is not good in straightness of a deposited material, and thus, the cathode electrode 250 may be deposited in the separation space between the partition wall 230 and the bank 220 in a process of depositing the cathode electrode 250.

Although not shown, an encapsulation layer may be further formed on the cathode electrode 250 and prevents penetration of water. The encapsulation layer may use various materials known to those skilled in the art. Also, although not shown, a color filter may be further formed for each pixel and on the cathode electrode 250, and in this case, white light may be emitted from the organic emission layer 240.

The gate insulation layer 120, the signal pad 300, the interlayer dielectric 140, the pad electrode 400, and the passivation layer 165 may be formed in the pad area PA of the substrate 100.

The gate insulation layer 120 may be formed on the substrate 100. The gate insulation layer 120 may be formed all over the pad area PA by extending from the active area AA.

The signal pad 300 may be formed on the gate insulation layer 120. The signal pad 300 may be formed on the same layer as a layer where the gate electrode 130 in the active area AA is disposed. The signal pad 300 may include a lower signal pad 301 and an upper signal pad 302.

The lower signal pad 301 may be formed between the gate insulation layer 120 and the upper signal pad 302 and may enhance an adhesive force between the gate insulation layer 120 and the upper signal pad 302. Also, the lower signal pad 301 protects a bottom of the upper signal pad 302, thereby preventing the bottom of the upper signal pad 302 from being corroded. Therefore, an oxidation rate of the lower signal pad 301 may be lower than that of the upper signal pad 302. That is, the lower signal pad 301 may be formed of a material which is stronger in corrosion resistance than a material forming the upper signal pad 302. As described above, the lower signal pad 301 may act as an adhesion enhancement layer or an anti-corrosion layer and may be formed of an alloy (MoTi) of Mo and Ti, but is not limited thereto.

The upper signal pad 302 may be formed on a top of the lower signal pad 301. The upper signal pad 302 may be formed of copper (Cu) which is metal having a low resistance, but is not limited thereto. The upper signal pad 302 may be formed of metal which is relatively lower in resistance than the lower signal pad 301. In order to lower a total resistance of the signal pad 300, a thickness of the upper signal pad 302 may be formed thicker than that of the lower signal pad 301.

The upper signal pad 302 may be formed of the same material as that of the upper gate electrode 132 to have the same thickness as that of the upper gate electrode 132, and the lower signal pad 301 may be formed of the same material as that of the lower gate electrode 131 to have the same thickness as that of the lower gate electrode 131. In this case, the signal pad 300 and the gate electrode 130 may be simultaneously formed through the same process.

The interlayer dielectric 140 may be formed on the signal pad 300. The interlayer dielectric 140 may be formed to cover a side surface of the signal pad 300, thereby preventing the side surface of the signal pad 300 from being corroded. The interlayer dielectric 140 may extend from the active area AA. A fourth contact hole CH4 exposing a portion of the signal pad 300 may be formed in the interlayer dielectric 140.

The pad electrode 400 is formed on the interlayer dielectric 140 and the signal pad 300. The pad electrode 400 is connected to the signal pad 300 through the fourth contact hole CH4. The pad electrode 400 may be exposed to the outside and connected to an external driver.

The pad electrode 400 protects a top of the signal pad 300. The top of the signal pad 300 may be configured by the upper signal pad 302 which is relatively vulnerable to corrosion, and thus, the pad electrode 400 may be formed to cover the top of the upper signal pad 302 exposed through the fourth contact hole CH4, thereby preventing the upper signal pad 302 from being corroded. As described above, since the pad electrode 400 prevents the top of the upper signal pad 302 from being corroded, the signal pad 300 may be formed in the above-described two-layer structure. That is, the top of the signal pad 300 may be configured by the upper signal pad 302 which is relatively vulnerable to corrosion. An oxidation rate of the pad electrode 400 may be lower than that of the upper signal pad 302. That is, the pad electrode 400 may be formed of a material which is stronger in corrosion resistance than a material forming the upper signal pad 302. Also, since the pad electrode 400 is exposed to the outside, the pad electrode 400 may be formed of a material which is strong in corrosion resistance. The pad electrode 400 may be formed of an alloy (MoTi) of Mo and Ti which is the same as the above-described material of the first lower source electrode 151 and/or the first lower drain electrode 161, but is not limited thereto. The pad electrode 400 may be formed of the same material as that of the first lower source electrode 151 and/or the first lower drain electrode 161 to have the same thickness as that of the first lower source electrode 151 and/or the first lower drain electrode 161. In this case, the pad electrode 400 and the first lower source electrode 151, the pad electrode 400 and the first lower drain electrode 161, or the pad electrode 400, the first lower source electrode 151, and the first lower drain electrode 161 may be pattern-formed through the same mask process, and thus, a separate process is not added.

The passivation layer 165 may be formed on the pad electrode 400. The passivation layer 165 may extend from the active area AA. A fifth contact hole CH5 exposing a portion of the pad electrode 400 may be formed in the passivation layer 165. Therefore, the pad electrode 400 may be connected to an external driving circuit through the fifth contact hole CH5.

Figure 3:
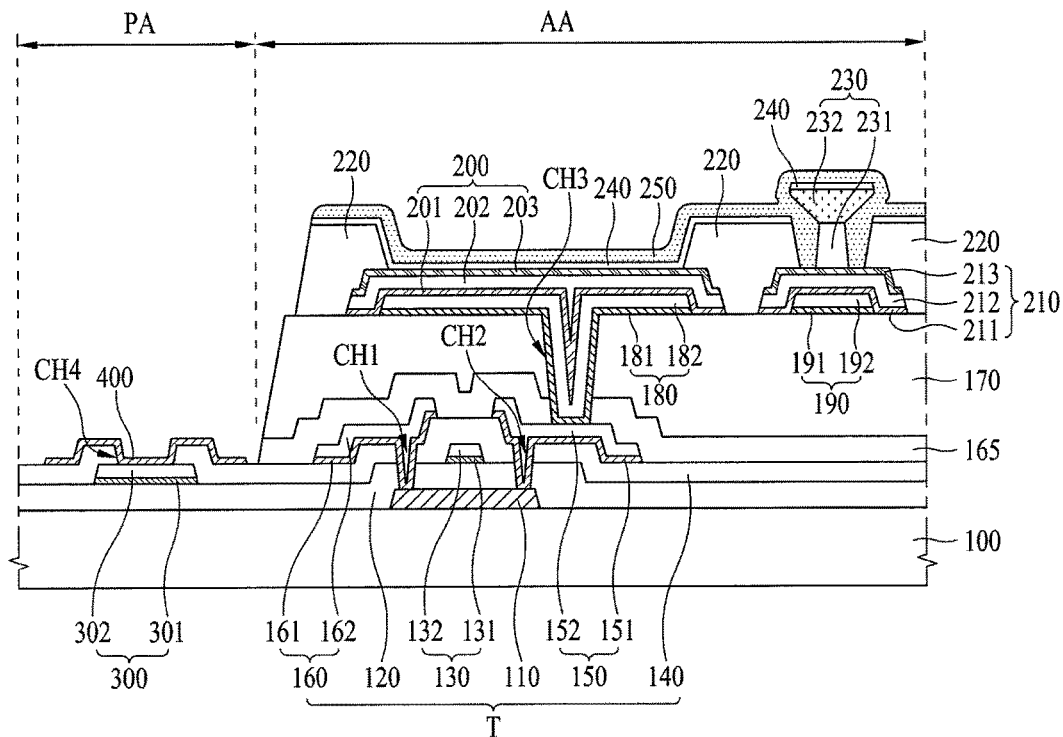
FIG. 3 is a cross-sectional view of an organic light emitting display apparatus according to another embodiment of the present invention.

FIG. 3 is a cross-sectional view of an organic light emitting display apparatus according to another embodiment of the present invention. Except that a structure of a pad area PA is changed, the organic light emitting display apparatus of FIG. 3 is the same as the above-described organic light emitting display apparatus of FIG. 2. Thus, like reference numerals refer to like elements. Hereinafter, only elements different from the above-described elements of FIG. 2 will be described in detail.

As seen in FIG. 3, according to another embodiment of the present invention, the passivation layer 165 may not extend to the pad area PA. Therefore, the passivation layer 165 may not cover a top of the pad electrode 400. As described above, since the passivation layer 165 is formed not to cover the top of the pad electrode 400, the whole top of the pad electrode 400 may be exposed to the outside, and thus, a connectivity of the pad electrode 400 and an external driver is enhanced.

FIGS. 4A to 4M are cross-sectional views illustrating a method of manufacturing an organic light emitting display apparatus according to an embodiment of the present invention and relate to a method of manufacturing the above-described organic light emitting display apparatus of FIG. 2. Thus, like reference numerals refer to like elements, and in a material and a structure of each element, the same or similar descriptions are not repeated.

Figure 4A:
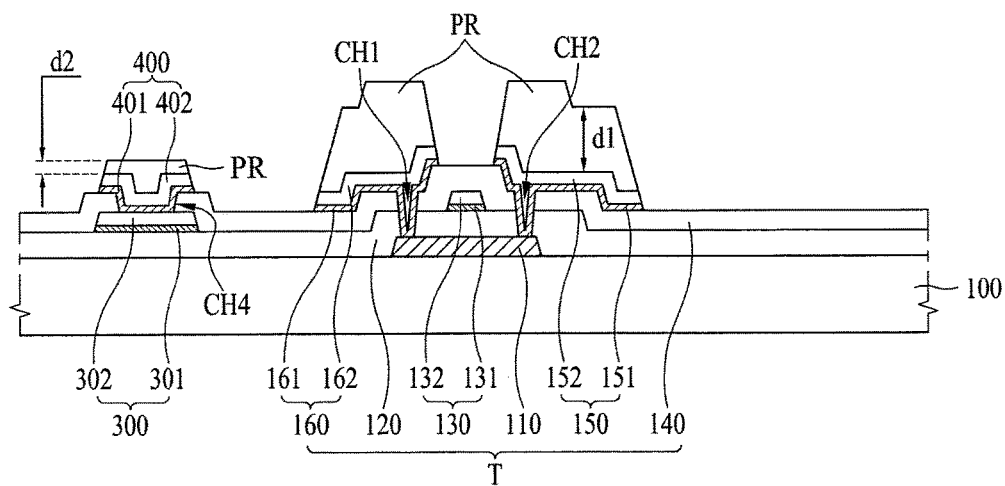
FIGS. 4A to 4M are cross-sectional views illustrating a method of manufacturing an organic light emitting display apparatus according to an embodiment of the present invention.

First, as seen in FIG. 4A, an active layer 110, a gate insulation layer 120, a gate electrode 130, a signal pad 300, an interlayer dielectric 140, a source electrode 150, a drain electrode 160 and a pad electrode 400 may be sequentially formed on a substrate 100.

To provide a more detailed description, the active layer 110 may be formed on the substrate 100, the gate insulation layer 120 may be formed on the active layer 110, the gate electrode 130 and the signal pad 300 may be formed on the gate insulation layer 120, the interlayer dielectric 140 may be formed on the gate electrode 130 and the signal pad 300, a first contact hole CH1 and a second contact hole CH2 may be formed in the gate insulation layer 120 and the interlayer dielectric 140, and a fourth contact hole CH4 may be formed in the interlayer dielectric 140. Subsequently, the drain electrode 160 which is connected to one end region of the active layer 110 through the first contact hole CH1, the source electrode 150 which is connected to the other end region of the active layer 110 through the second contact hole CH2, and the pad electrode 400 which is connected to the signal pad 300 through the fourth contact hole CH4 may be formed.

Here, the active layer 110, the gate electrode 130, the source electrode 150, and the drain electrode 160 may be formed in an active area AA, the gate insulation layer 120 and the interlayer dielectric 140 may be formed to extend from the active area AA to a pad area PA, and the signal pad 300 and the pad electrode 400 may be formed in the pad area AA. Through such a process, a TFT T may be formed in the active area AA, and the signal pad 300 and the pad electrode 400 may be formed in the pad area PA.

The gate electrode 130 may be configured with a lower gate electrode 131 and an upper gate electrode 132, and the signal pad 300 may be configured with a lower signal pad 301 and an upper signal pad 302. The gate electrode 130 and the signal pad 300 may be simultaneously formed of the same material by the same patterning process.

The source electrode 150 may be configured with a lower source electrode 151 and an upper source electrode 152, the drain electrode 160 may be configured with a lower drain electrode 161 and an upper drain electrode 162, and the pad electrode 400 may be configured with a lower pad electrode 401 and an upper pad electrode 402. The source electrode 150, the drain electrode 160, and the pad electrode 400 may be simultaneously formed of the same material by the same patterning process.

The source electrode 150, the drain electrode 160, and the pad electrode 400 may be pattern-formed by using a photoresist (PR) pattern as a mask. That is, a lower electrode material layer and an upper electrode material layer for forming the source electrode 150, the drain electrode 160, and the pad electrode 400 may be sequentially deposited, and then, the PR pattern may be formed on the upper electrode material layer. By etching the lower electrode material layer and the upper electrode material layer with the PR pattern as a mask, the source electrode 150, the drain electrode 160, and the pad electrode 400 may be formed as illustrated.

In this case, the PR pattern may include an area having a relatively thick first thickness d1 and another area having a relatively thin second thickness d2. The area having the first thickness d1 may correspond to upper regions of the source electrode 150 and the drain electrode 160. The other area having the second thickness d2 may correspond to an upper region of the pad electrode 400. Also, the PR pattern may not be formed (e.g. may be omitted) in an area which does not overlap the source electrode 150, the drain electrode 160, and the pad electrode 400.

The PR pattern which includes the area having the first thickness d1 and the other area having the second thickness d2 may be obtained through a half-tone mask process.

Figure 4B:
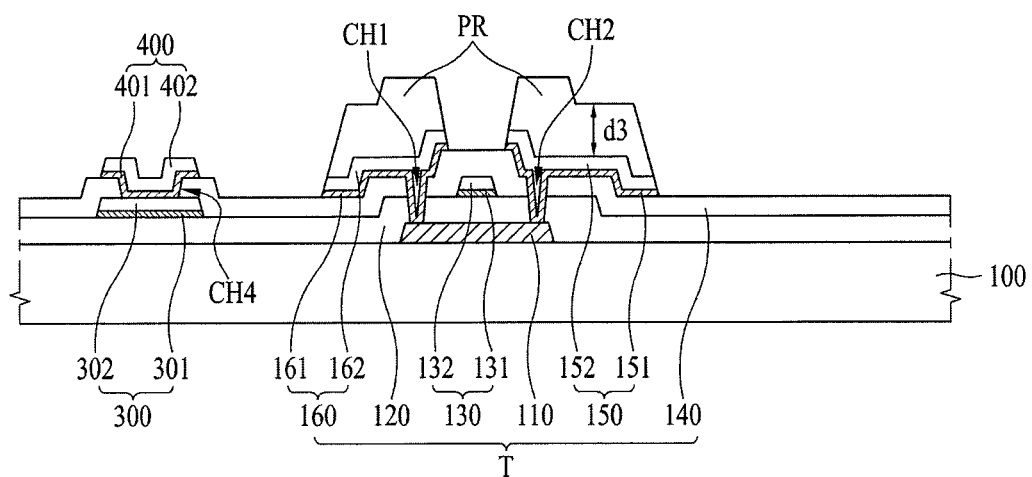

Subsequently, as seen in FIG. 4B, by ashing the PR pattern, a PR pattern on the pattern electrode 400 may be removed.

That is, when the PR pattern is ashed, a PR pattern which has the relatively thin second thickness d2 and is disposed on the pad electrode 400 may be removed, and only a PR pattern which has the relatively thick first thickness d1 and is disposed on the source electrode 150 and the drain electrode 160 may be left. In this case, the PR pattern which is disposed on the source electrode 150 and the drain electrode 160 may be left in a state of having a third thickness d3 which is thinner than the first thickness d1.

Figure 4C:
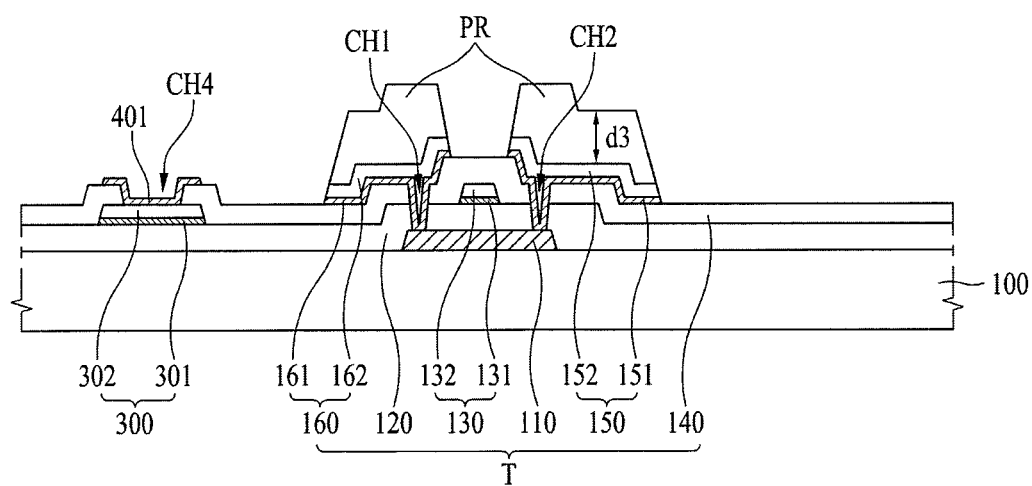

Subsequently, as seen in FIG. 4C, by using the left PR pattern as a mask, the upper pad electrode 402 may be removed without etching the upper source electrode 152 and the upper drain electrode 162.

To provide a more detailed description on this, when the upper pad electrode 402 is formed of copper (Cu) and the lower pad electrode 401 is formed of an alloy (MoTi) of Mo and Ti, only the upper pad electrode 402 may be removed by an etchant for selectively etching only Cu. Particularly, by using an etchant which contains a three-component mixed acid consisting of a phosphoric acid, a nitric acid, and an acetic acid, the lower pad electrode 401 may be left as-is, and the upper pad electrode 402 may be removed in the etching process. A component of the etchant may be changed based on a detailed material of the upper pad electrode 402.

The upper pad electrode 402 formed of a material vulnerable to corrosion may be removed in a process of pattern-forming the source electrode 150 and the drain electrode 160, and thus, a pad electrode (400 of FIG. 2) including the lower pad electrode 401 which has excellent corrosion resistance and is exposed to the outside may be obtained.

Figure 4D:
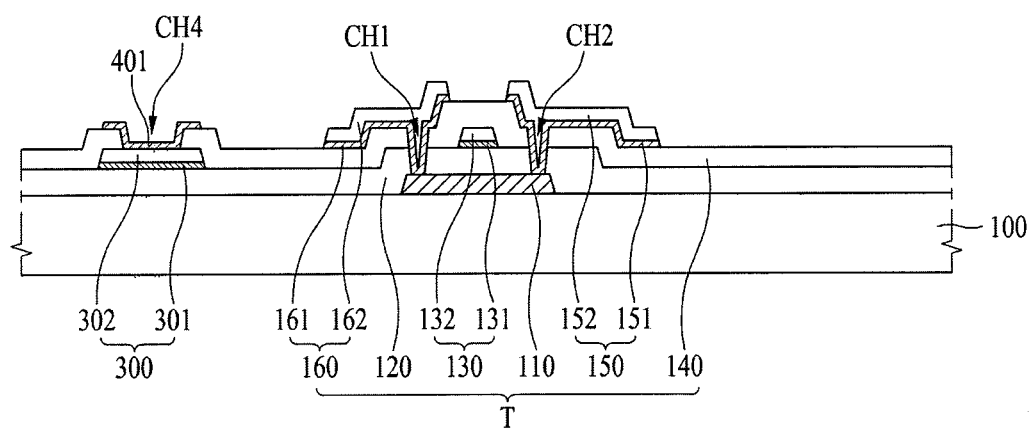

Subsequently, as seen in FIG. 4D, the source electrode 150 and the drain electrode 160 may be exposed to the outside by striping the left PR pattern.

As described above, according to an embodiment of the present invention, by using the PR pattern which includes the area having the first thickness d1 and the other area having the second thickness d2 and has been obtained through the half-tone mask process, the source electrode 150, the drain electrode 160, and the pad electrode (400 of FIG. 2) including the lower pad electrode 401 may be pattern-formed through a one-time mask process.

Figure 4E:
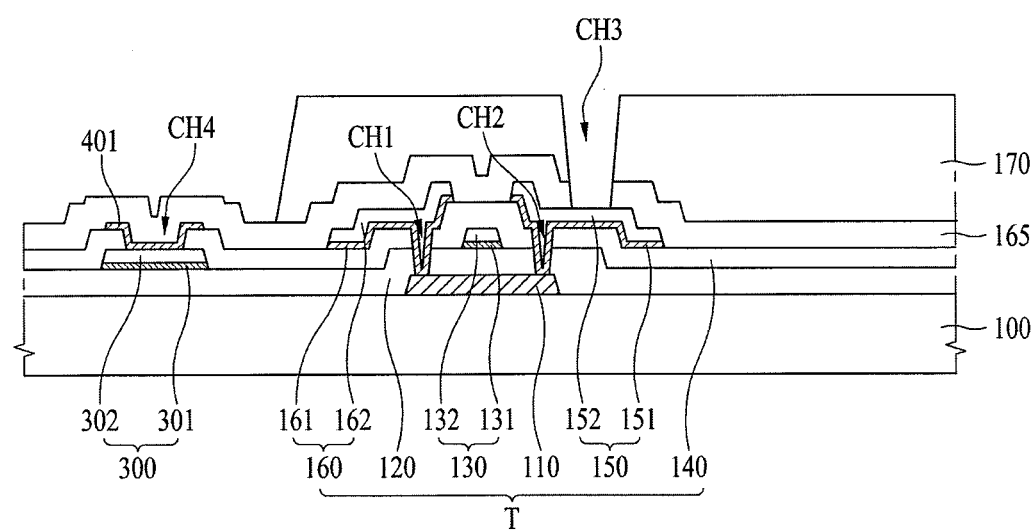

Subsequently, as seen in FIG. 4E, a passivation layer 165 may be formed on the source electrode 150, the drain electrode 160, and the lower pad electrode 401, and a planarization layer 170 may be formed on the passivation layer 165. A third contact hole CH3 may be formed in a predetermined region of each of the passivation layer 165 and the planarization layer 170, and thus, the source electrode 150 may be exposed to the outside through the third contact hole CH3.

The passivation layer 165 may be formed to extend from an active area AA to a pad area PA, and the planarization layer 170 may be formed in the active area AA. Since a TFT is not formed in the pad area PA, the necessity for planarizing a surface of the pad area PA is small, and thus, the planarization layer 170 may not be formed (e.g. may be omitted) in the pad area PA.

According to an embodiment of the present invention, the lower pad electrode 401 may not be exposed to the outside in a process of forming the third contact hole CH3 which externally exposes the source electrode 150. Since the lower pad electrode 401 should be connected to an external driver, a region of the passivation layer 165 which covers a top of the lower pad electrode 401 may be removed, and a process of removing the region of the passivation layer 165 which covers the top of the lower pad electrode 401 may be performed simultaneously with the process of forming the third contact hole CH3. However, if the process of removing the region of the passivation layer 165 which covers the top of the lower pad electrode 401 is performed simultaneously with the process of forming the third contact hole CH3, the lower pad electrode 401 can be damaged by an etchant which is used in a later-performed process of pattern-forming the first anode electrode 180 and the first auxiliary electrode 401. Therefore, in an embodiment of the present invention, the lower pad electrode 401 may not be exposed to the outside in the process of forming the third contact hole CH3, for preventing the lower pad electrode 401 from being damaged by the etchant.

Figure 4F:
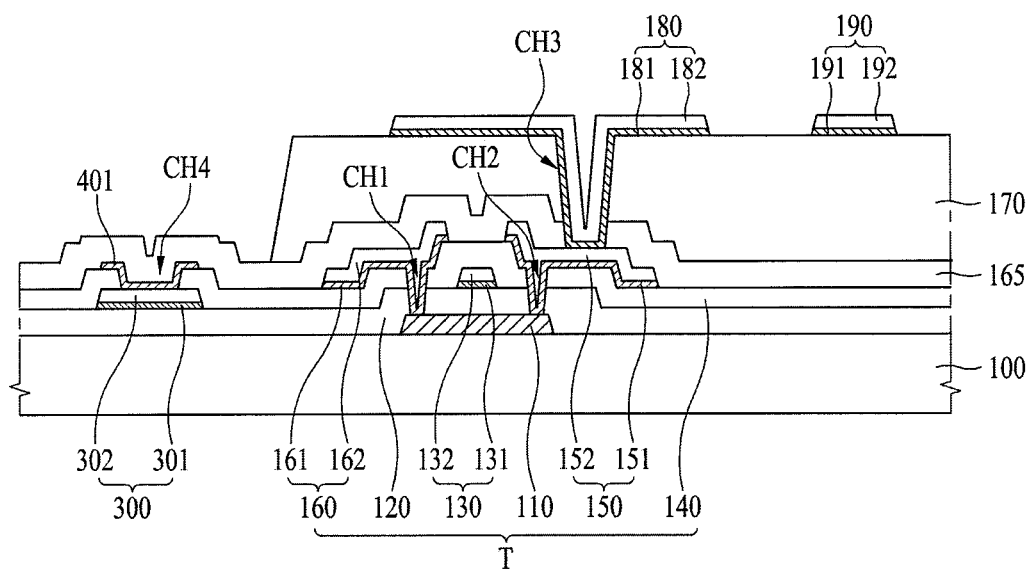

Subsequently, as seen in FIG. 4F, a first anode electrode 180 and a first auxiliary electrode 190 may be formed to be separated from each other on the planarization layer 170 disposed in the active area AA. In detail, the first anode electrode 180 may be formed to be connected to the source electrode 150 through the third contact hole CH3.

The first anode electrode 180 may be configured with a first lower anode electrode 181 and a first upper anode electrode 182, and the first auxiliary electrode 190 may be configured with a first lower auxiliary electrode 191 and a first upper auxiliary electrode 192.

The first anode electrode 180 and the first auxiliary electrode 190 may be simultaneously formed of the same material through the same patterning process.

A process of pattern-forming the first anode electrode 180 and the first auxiliary electrode 190 may include an etching process using an etchant. A lower pad electrode 401 formed in the pad area PA may be etched together in the etching process. According to an embodiment of the present invention, as described above, the passivation layer 165 prevents the lower pad electrode 401 from being damaged.

Figure 4G:
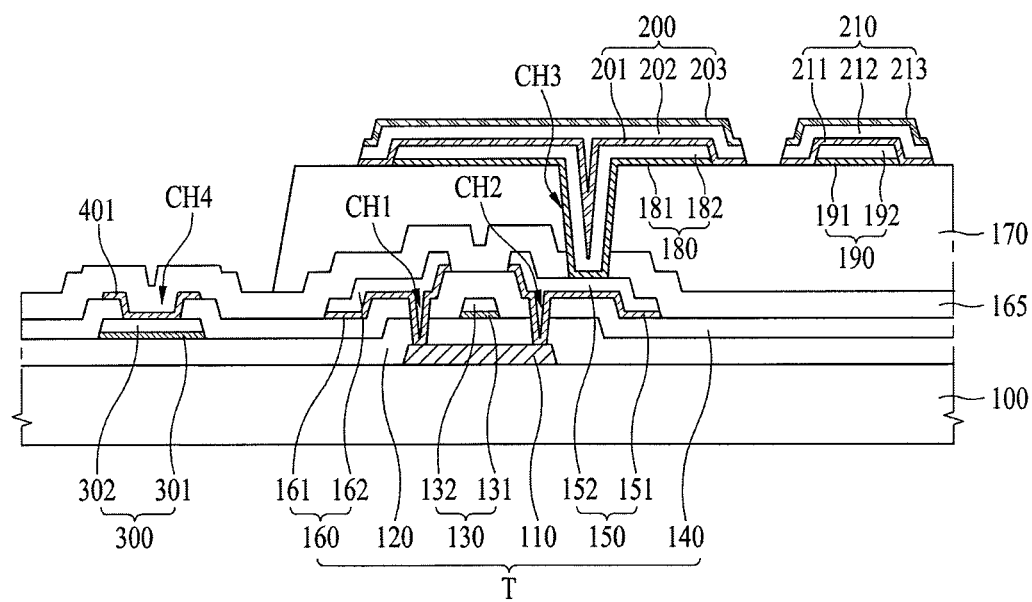

Subsequently, as seen in FIG. 4G, a second anode electrode 200 may be formed on the first anode electrode 180 disposed in the active area AA, and a second auxiliary electrode 210 may be formed on the first auxiliary electrode 190 disposed in the active area AA.

The second anode electrode 200 may be formed to cover a top and a side surface of the first anode electrode 180, and the second auxiliary electrode 210 may be formed to cover a top and a side surface of the first auxiliary electrode 190. The second anode electrode 200 and the second auxiliary electrode 210 may be simultaneously formed of the same material through the same patterning process.

The second anode electrode 200 may include a second lower anode electrode 201, a second center anode electrode 202, and a second upper anode electrode 203. The second auxiliary electrode 210 may include a second lower auxiliary electrode 211, a second center auxiliary electrode 212, and a second upper auxiliary electrode 213.

Figure 4H:
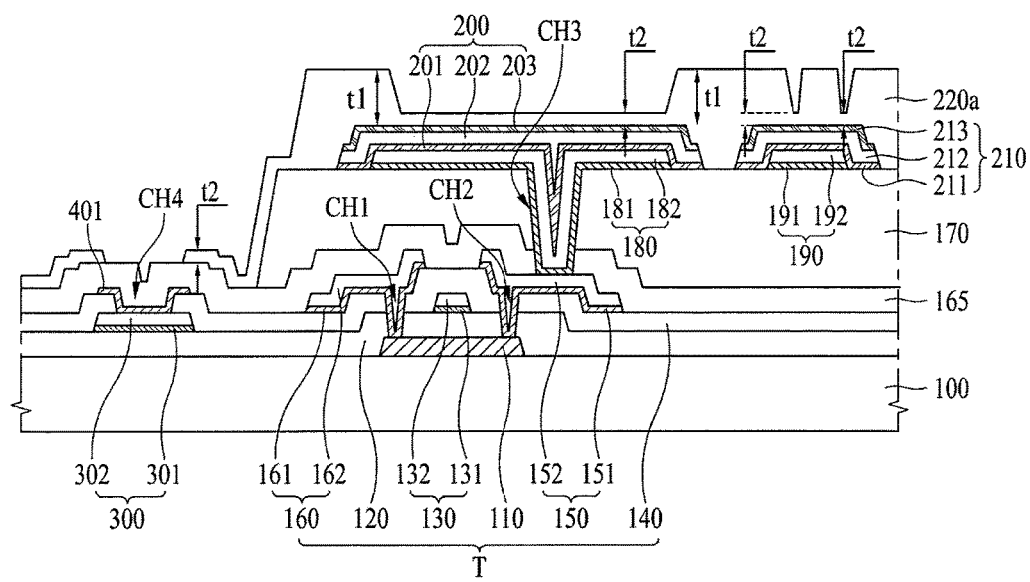
Figure 4I:
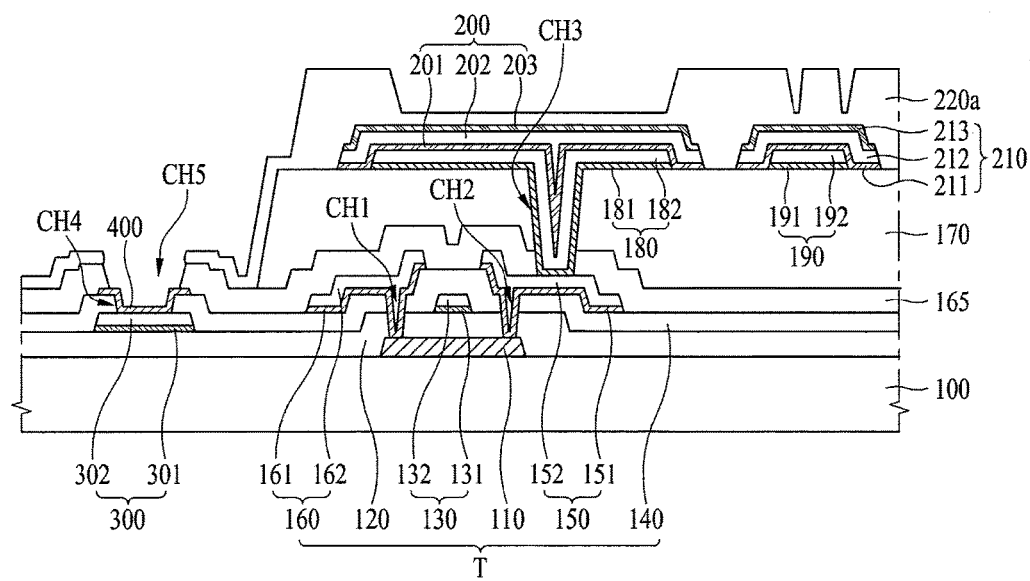
Figure 4J:
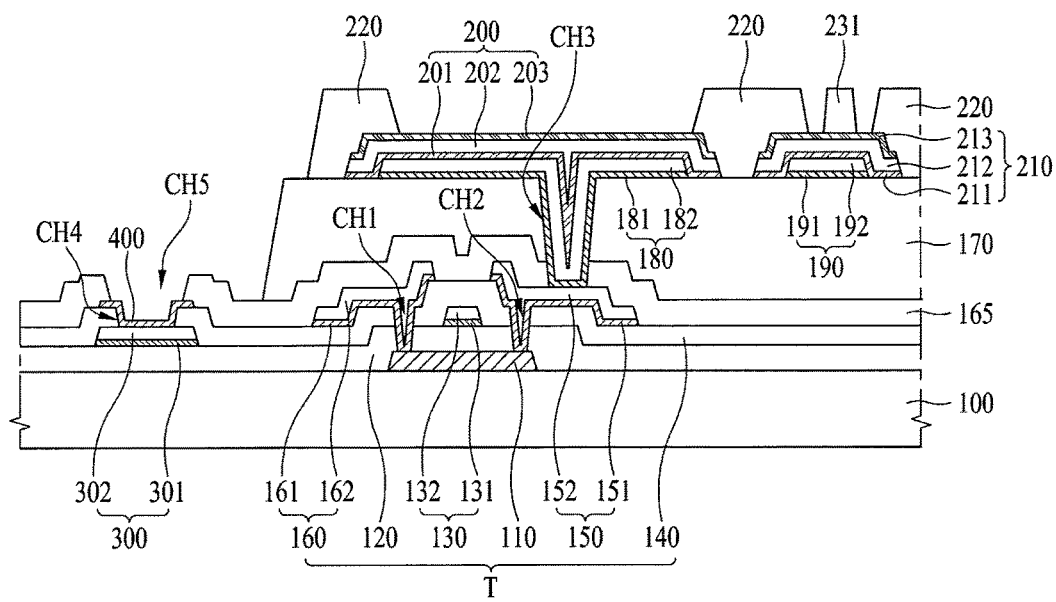

Hereinafter, FIGS. 4H to 4J illustrate a detailed process of removing a region of the passivation layer 165 covering a top of the lower pad electrode 401 in a process of forming a bank 220.

As seen in FIG. 4H, a PR pattern 220a may be formed in each of the active area AA and the pad area PA.

The PR pattern 220a may be formed on the second anode electrode 200, the second auxiliary electrode 210, the planarization layer 170, and the passivation layer 165.

The PR pattern 220a may include an area having a relatively thick first thickness t1 and another area having a relatively thin second thickness t2. The area having the first thickness t1 may correspond to a side region of the second anode electrode 200 and may also correspond to a side region and a partial center region of the second auxiliary electrode 210. The other area having the second thickness t2 may correspond to a space between areas having the first thickness t1. In detail, the other area having the second thickness t2 may correspond to a center region of the second anode electrode 200, correspond to a space between areas having the first thickness t1 in the center region of the second auxiliary electrode 210, and correspond to the pad area PA. Also, the PR pattern 220a may not be formed (e.g. may be omitted) in an area overlapping the lower pad electrode 401.

The PR pattern 220a, having a structure which includes the area having the first thickness t1 and the other area having the second thickness t2 and is not formed in the area overlapping the lower pad electrode 401, may be obtained through the half-tone mask process.

Subsequently, as seen in FIG. 4I, by using the PR pattern 220a as a mask, a fifth contact hole CH5 may be formed by removing a region of the passivation layer 165 which covers a top of the lower pad electrode 401. That is, since the fifth contact hole CH5 is formed in the passivation layer 165, the lower pad electrode 401 may be exposed to the outside through the fifth contact hole CH5.

Subsequently, as seen in FIG. 4J, the bank 220 and a first partition wall 231 may be formed by aching the PR pattern 220a.

When the PR pattern 220a is ashed, the PR pattern 220a may be removed from the area having the relatively thin second thickness t2 and may be left in the area having the relatively thick first thickness t1, and thus, the bank 220 and the first partition wall 231 may be formed by the left PR pattern 220a.

To provide a more detailed description, since the PR pattern 220a is removed from the area having the relatively thin second thickness t2, a top of the second anode electrode 200 may be exposed, a portion of a top of the second auxiliary electrode 210 may be exposed, and a top of the passivation layer 165 may be exposed. Also, since the PR pattern 220a is left in the area having the relatively thick first thickness t1, the bank 220 may be formed on one side and the other side of the second anode electrode 200, the bank 220 may be formed on one side and the other side of the second auxiliary electrode 220, and the first partition wall 231 may be formed on the top of the second auxiliary electrode 210. The first partition wall 231 may be formed to be separated from the bank 220 by a certain distance.

According to an embodiment of the present invention, the fifth contact hole CH5 which externally exposes the lower pad electrode 401 may be formed by using the PR pattern 220a as a mask, and the bank 220 and the first partition wall 231 may be formed by using the PR pattern 220a which is left by ashing the PR pattern 220a. As described above, according to an embodiment of the present invention, since the fifth contact hole CH5, the bank 220, and the first partition wall 231 are formed through a one-time mask process, the number of mask processes is reduced.

Figure 4K:
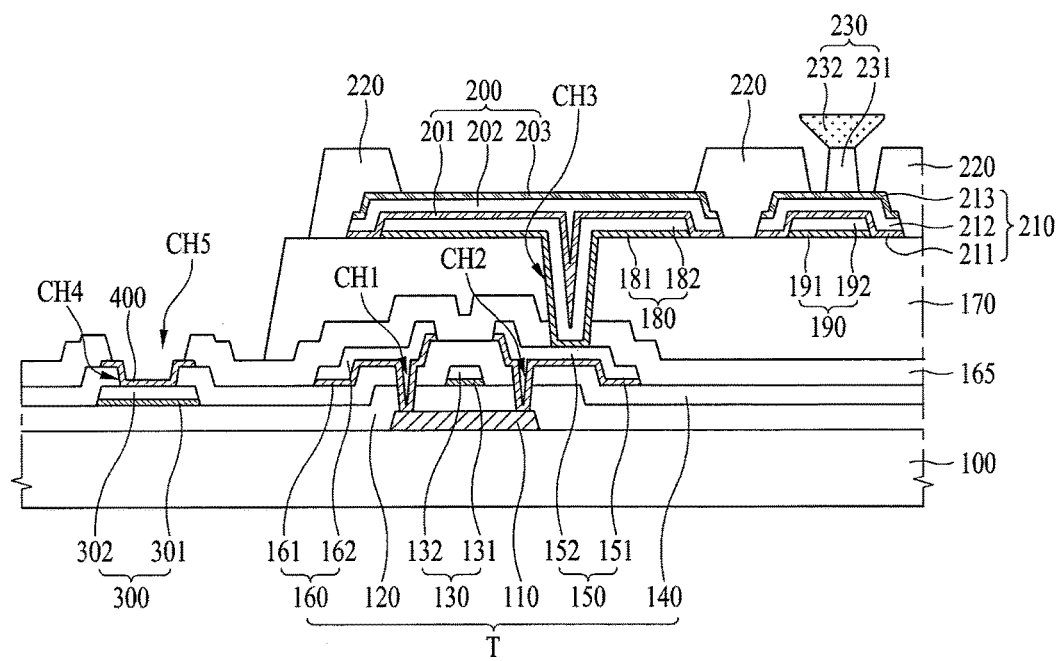

Subsequently, as seen in FIG. 4K, a second partition wall 232 may be formed on a top of the first partition wall 231, and thus, a partition wall 230 including the first and second partition walls 231 and 232 may be formed. In order for a top of the partition wall 230 to act as eaves, a width of a top of the second partition wall 232 may be formed greater than that of a bottom of the second partition wall 232. Particularly, with respect to a case where the organic light emitting display apparatus is seen from the front thereof, the top of the second partition wall 232 may cover a separation space between the partition wall 230 and the bank 220, and thus, in a below-described process of depositing an organic emission layer 240, the organic emission layer 240 is not deposited in the separation space between the partition wall 230 and the bank 220.

Figure 4L:
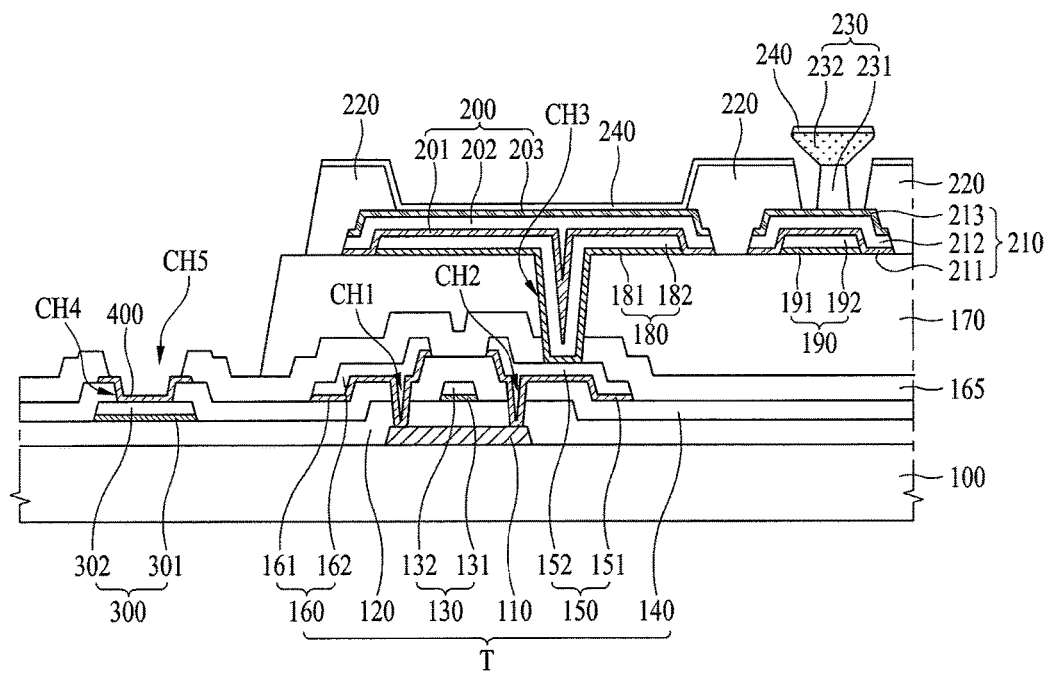

Subsequently, as seen in FIG. 4L, the organic emission layer 240 may be formed on the second anode electrode 200. The organic emission layer 240 may be formed by a deposition process such as an evaporation process which is excellent in straightness of a deposited material, and thus, the organic emission layer 240 may be deposited on tops of the bank 220 and the partition wall 230, but the organic emission layer 240 is not deposited in the separation space between the partition wall 230 and the bank 220. That is, the top of the partition wall 230 may act as the eaves in depositing the organic emission layer 240, and thus, even when the organic emission layer 240 is deposited without a mask pattern which covers the top of the second auxiliary electrode 210, the organic emission layer 240 is not deposited in the separation space between the partition wall 230 and the bank 220.

Figure 4M:
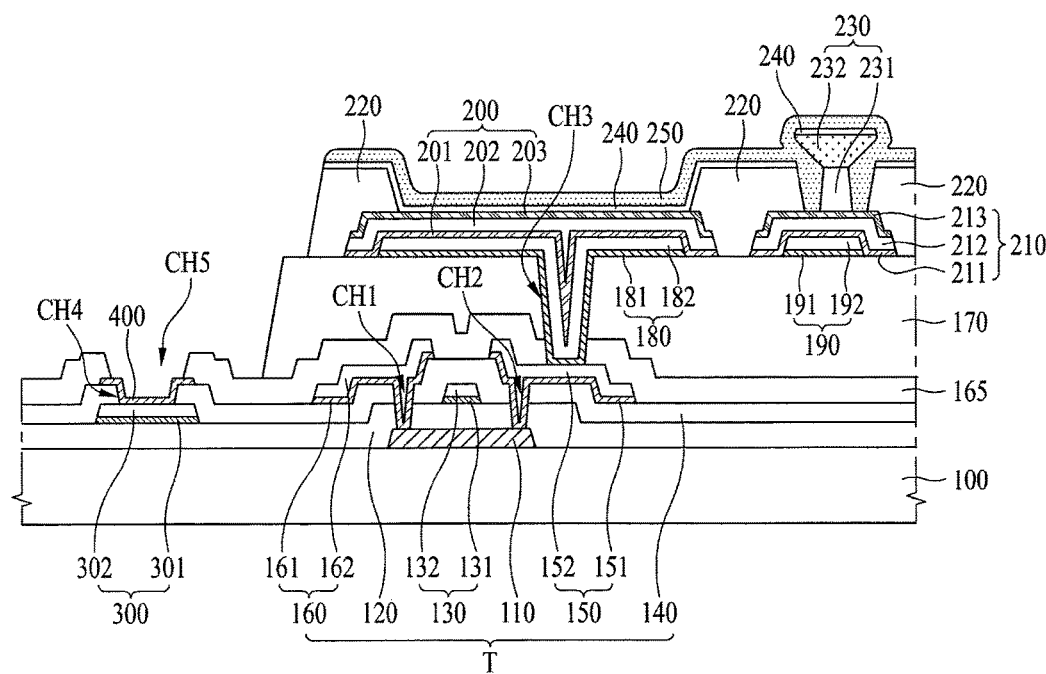

Subsequently, as seen in FIG. 4M, a cathode electrode 250 may be formed on the organic emission layer 240.

The cathode electrode 250 may be formed to be connected to the second auxiliary electrode 210 through the separation space between the partition wall 230 and the bank 220. The cathode electrode 250 may be formed by a deposition process such as a sputtering process which is not good in straightness of a deposited material, and thus, the cathode electrode 250 may be deposited in the separation space between the partition wall 230 and the bank 220 in a process of depositing the cathode electrode 250.

As described above, according to an embodiment of the present invention, since the fifth contact hole CH5 for externally exposing the lower pad electrode 401 is formed after the second anode electrode 200 and the second auxiliary electrode 210 are formed, the lower pad electrode 401 is prevented from being damaged by an etchant in a process of pattern-forming the first anode electrode 180 and the first auxiliary electrode 190. Also, by removing a partial region of the passivation layer 165 in a process of forming the bank 220 and the first partition wall 231, the fifth contact hole CH5 may be formed without a separate process being added.

FIGS. 5A to 5L are cross-sectional views illustrating a method of manufacturing an organic light emitting display apparatus according to another embodiment of the present invention and relate to a method of manufacturing the above-described organic light emitting display apparatus of FIG. 3. Thus, like reference numerals refer to like elements, and in a material and a structure of each element, the same or similar descriptions are not repeated.

Figure 5A:
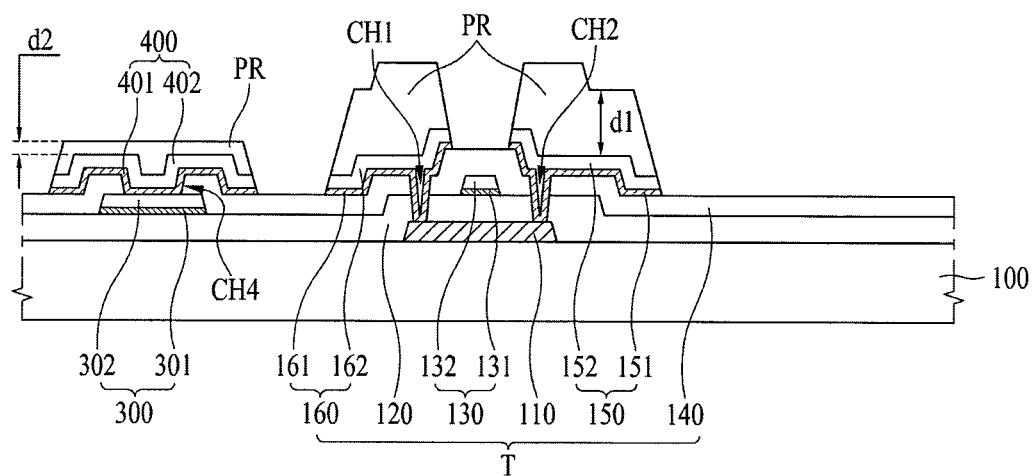
FIGS. 5A to 5L are cross-sectional views illustrating a method of manufacturing an organic light emitting display apparatus according to another embodiment of the present invention.

First, as seen in FIG. 5A, an active layer 110, a gate insulation layer 120, a gate electrode 130, a signal pad 300, an interlayer dielectric 140, a source electrode 150, a drain electrode 160, and a pad electrode 400 may be sequentially formed on a substrate 100. Therefore, a TFT T may be formed in the active area AA, and the signal pad 300 and the pad electrode 400 may be formed in the pad area PA.

The source electrode 150, the drain electrode 160, and the pad electrode 400 may be pattern-formed by using, as a mask, a PR pattern which includes an area having a relatively thick first thickness d1 and another area having a relatively thin second thickness d2. Such a process illustrated in FIG. 5A is the same as the above-described process of FIG. 4A.

Figure 5B:
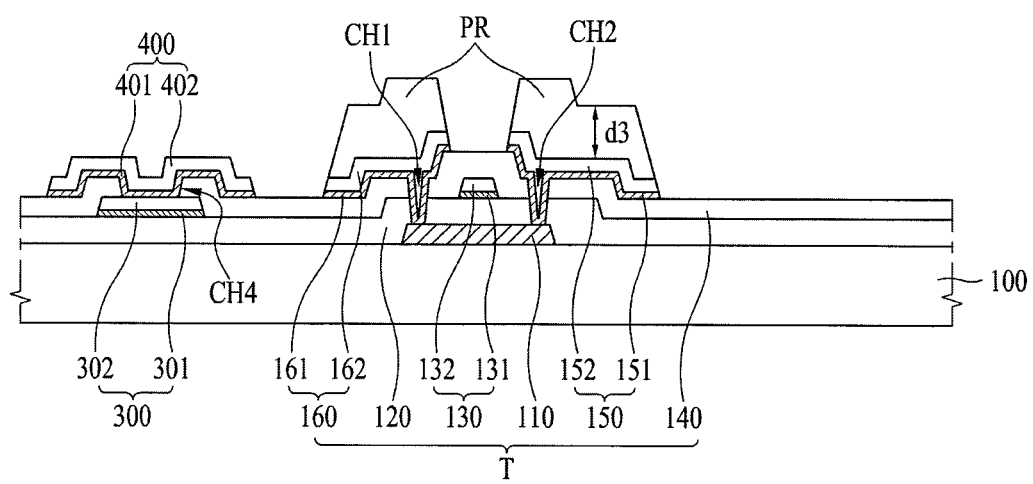

Subsequently, as seen in FIG. 5B, by ashing the PR pattern, a PR pattern on the pad electrode 400 may be removed. Due to the ashing, a PR pattern which has the relatively thin second thickness d2 and is disposed on the pad electrode 400 may be removed, and a PR pattern which has the relatively thick first thickness d1 and is disposed on the source electrode 150 and the drain electrode 160 may be left in a state of having a third thickness d3. Such a process illustrated in FIG. 5B is the same as the above-described process of FIG. 4B.

Figure 5C:
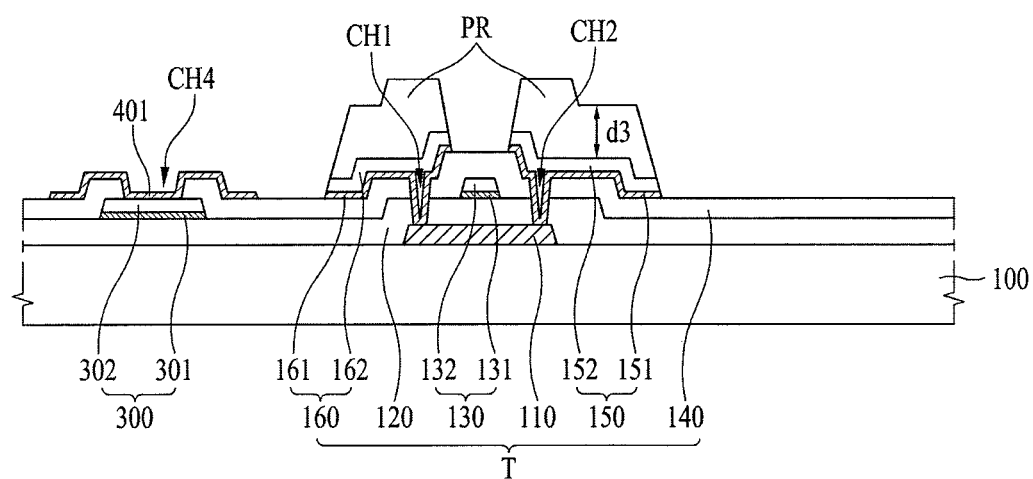

Subsequently, as seen in FIG. 5C, by using the left PR pattern as a mask, the upper pad electrode 402 may be removed without etching the upper source electrode 152 and the upper drain electrode 162.

The upper pad electrode 402 formed of a material vulnerable to corrosion may be removed in a process of pattern-forming the source electrode 150 and the drain electrode 160, and thus, a pad electrode (400 of FIG. 2) including the lower pad electrode 401 which has excellent corrosion resistance and is exposed to the outside may be obtained. Such a process illustrated in FIG. 5C is the same as the above-described process of FIG. 4C.

Figure 5D:
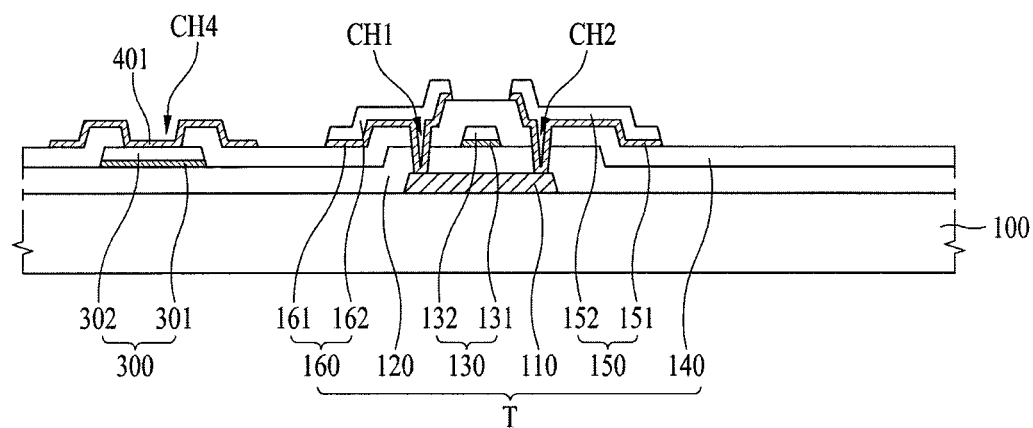

Subsequently, as seen in FIG. 5D, the source electrode 150 and the drain electrode 160 may be exposed to the outside by striping the left PR pattern. Such a process illustrated in FIG. 5D is the same as the above-described process of FIG. 4D.

Figure 5E:
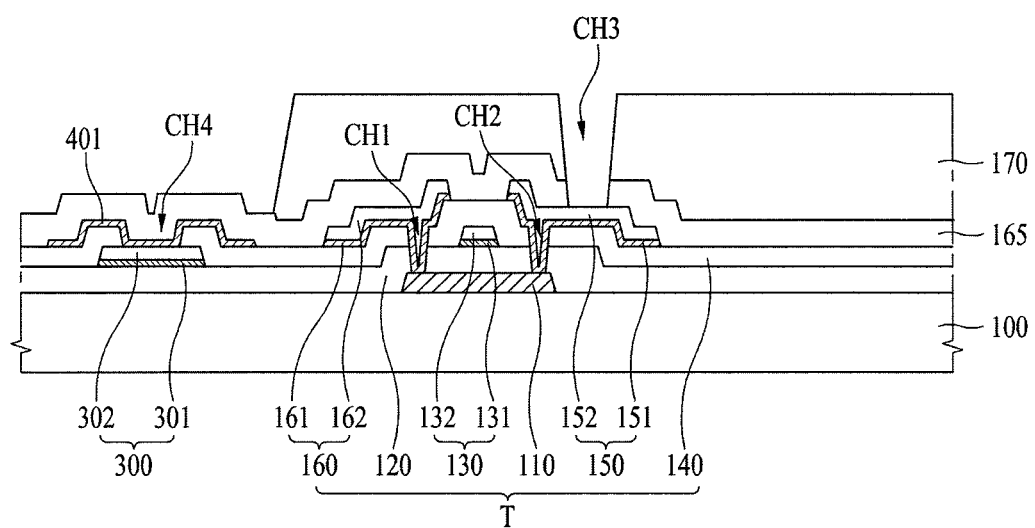

Subsequently, as seen in FIG. 5E, a passivation layer 165 may be formed on the source electrode 150, the drain electrode 160, and the signal pad 300, and a planarization layer 170 may be formed on the passivation layer 165. The planarization layer 170 may include a third contact hole CH3. Such a process illustrated in FIG. 5E is the same as the above-described process of FIG. 4E.

Figure 5F:
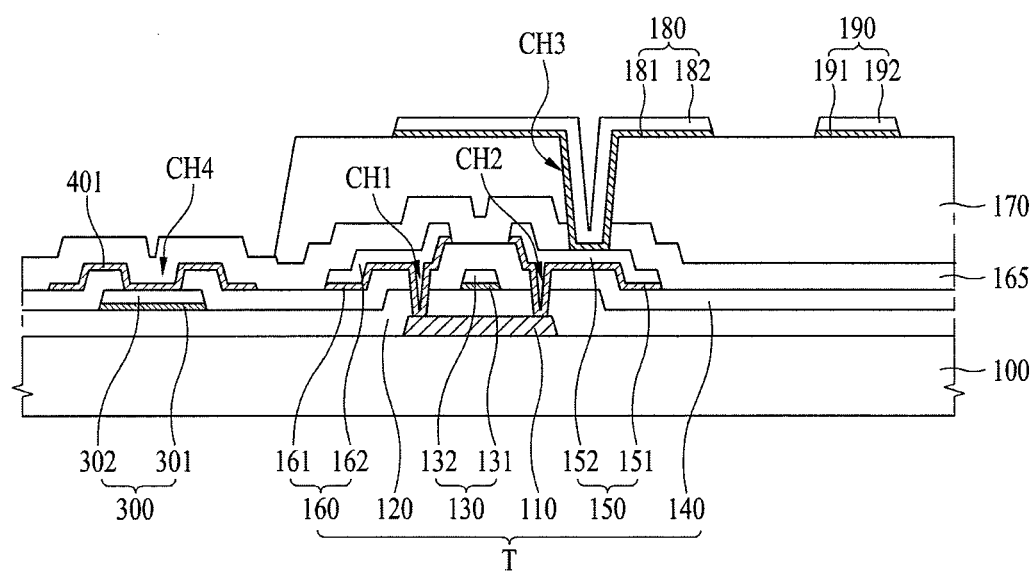

Subsequently, as seen in FIG. 5F, a first anode electrode 180 and a first auxiliary electrode 190 may be formed to be separated from each other on the planarization layer 170 disposed in the active area AA. In detail, the first anode electrode 180 may be formed to be connected to the source electrode 150 through the third contact hole CH3. Such a process illustrated in FIG. 5F is the same as the above-described process of FIG. 4F.

Figure 5G:
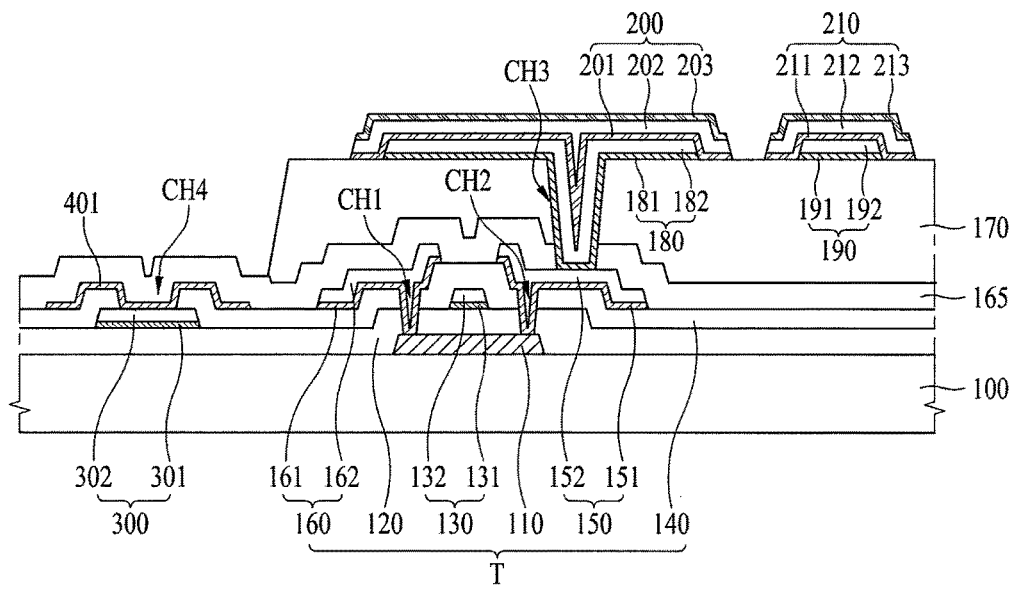

Subsequently, as seen in FIG. 5G, a second anode electrode 200 may be formed on the first anode electrode 180 disposed in the active area AA, and a second auxiliary electrode 210 may be formed on the first auxiliary electrode 190 disposed in the active area AA. Such a process illustrated in FIG. 5G is the same as the above-described process of FIG. 4G.

Figure 5H:
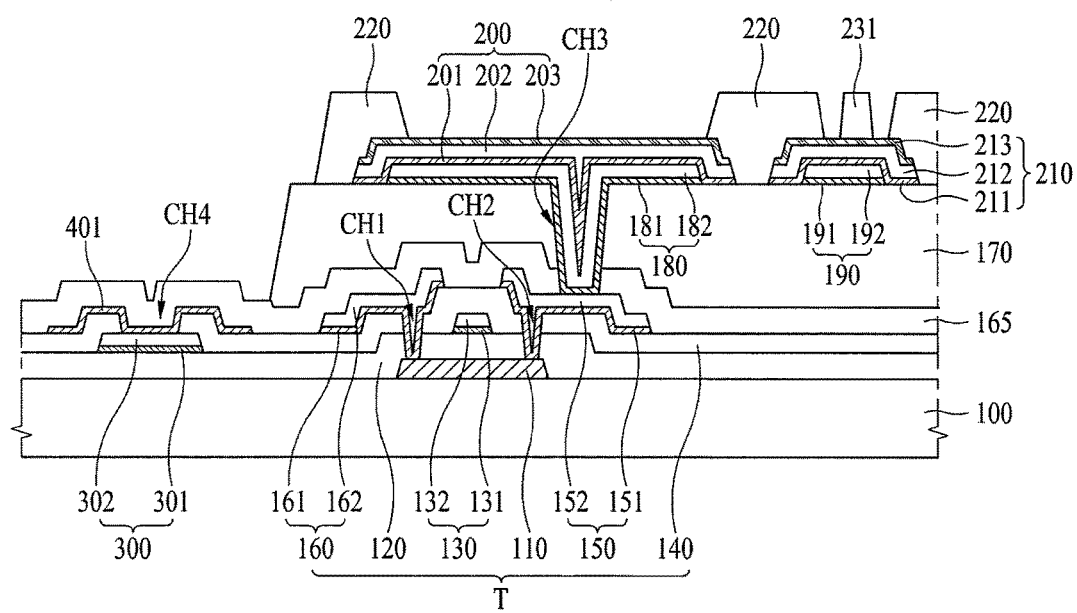

Subsequently, as seen in FIG. 5H, a bank 220 may be formed on one side and the other side of the second anode electrode 200 to expose a top of the second anode electrode 200. Also, the bank 220 may be formed on one side and the other side of the second auxiliary electrode 210 to expose a top of the second auxiliary electrode 210. Also, a first partition wall 231 may be formed on the exposed top of the second auxiliary electrode 210. The first partition wall 231 may be formed to be separated from the bank 220 by a certain distance, and thus, a separation space may be provided between the first partition wall 231 and the bank 220. The first partition wall 231 and the bank 220 may be simultaneously formed of the same material through the same patterning process.

Figure 5I:
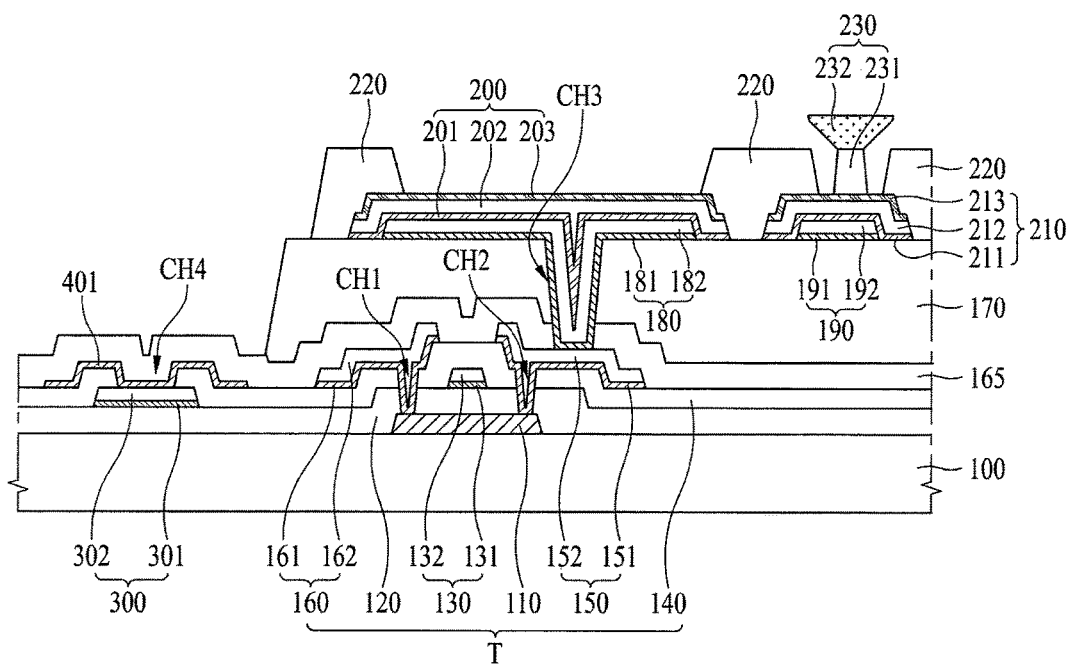

Subsequently, as seen in FIG. 5I, a second partition wall 232 may be formed on a top of the first partition wall 231, and thus, a partition wall 230 including the first and second partition walls 231 and 232 may be formed.

In order for a top of the partition wall 230 to act as eaves, a width of a top of the second partition wall 232 may be formed greater than that of a bottom of the second partition wall 232. Particularly, with respect to a case where the organic light emitting display apparatus is seen from the front thereof, the top of the second partition wall 232 may cover a separation space between the partition wall 230 and the bank 220, and thus, in a below-described process of depositing an organic emission layer 240, the organic emission layer 240 is not deposited in the separation space between the partition wall 230 and the bank 220.

Figure 5J:
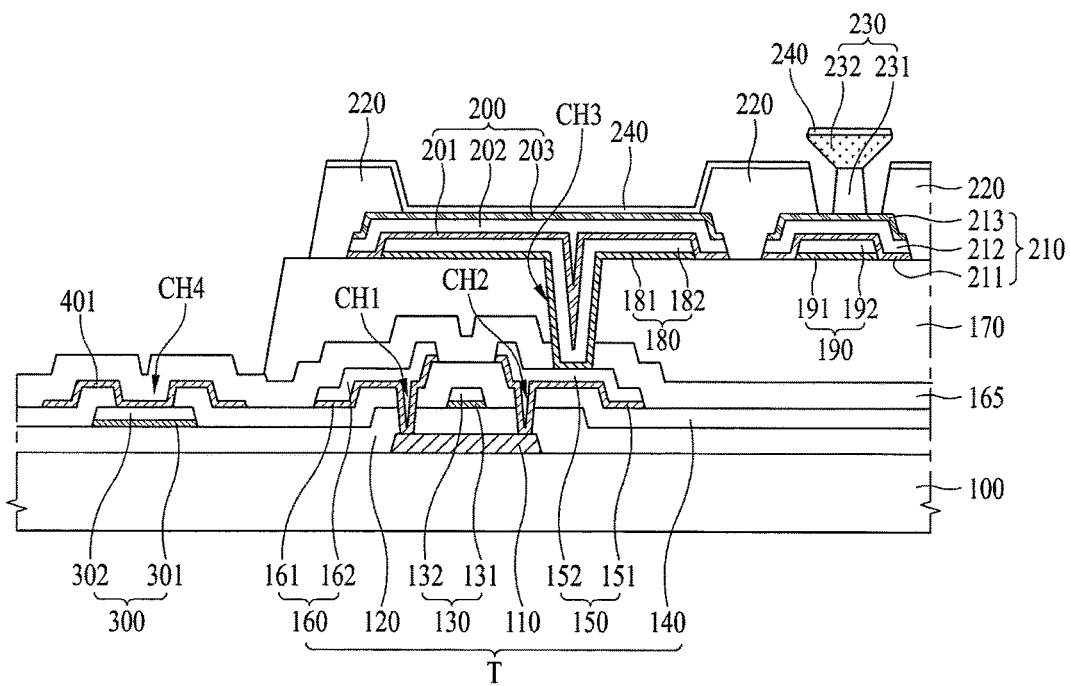

Subsequently, as seen in FIG. 5J, an organic emission layer 240 may be formed on the second anode electrode 200. The organic emission layer 240 may be deposited on tops of the bank 220 and the partition wall 230, but is not deposited in the separation space between the partition wall 230 and the bank 220.

Figure 5K:
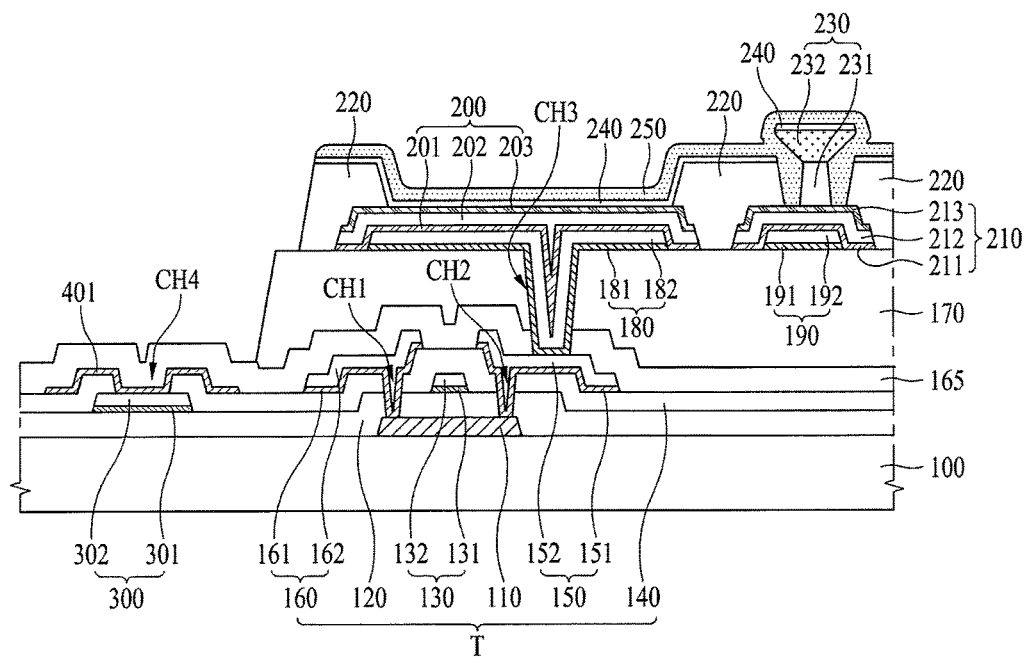

Subsequently, as seen in FIG. 5K, a cathode electrode 250 may be formed on the organic emission layer 240. The cathode electrode 250 may be formed to be connected to the second auxiliary electrode 210 through the separation space between the partition wall 230 and the bank 220.

Figure 5L:
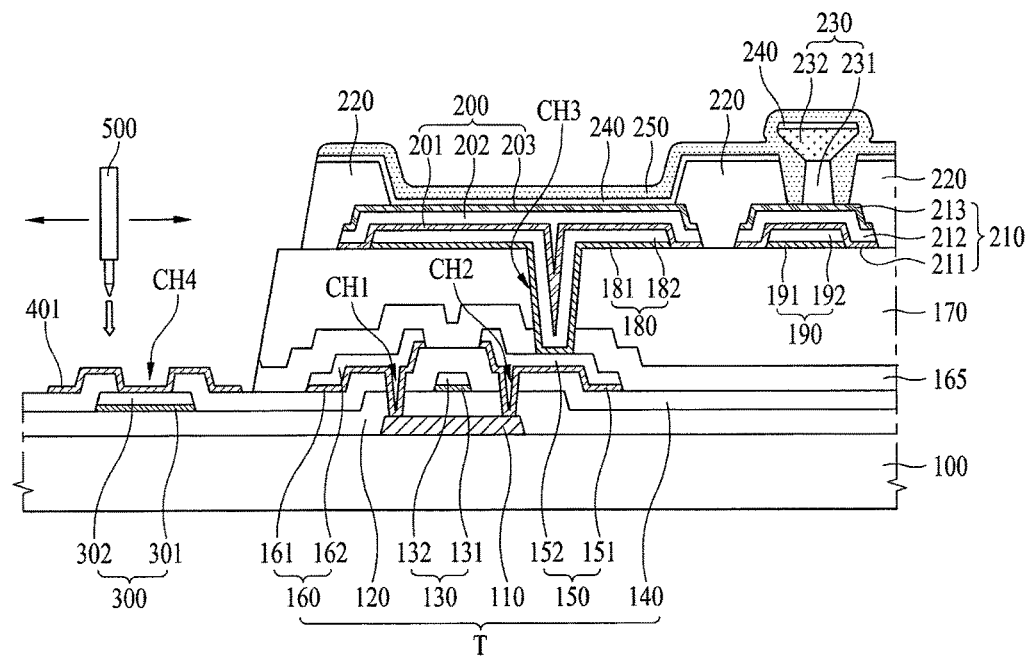

Subsequently, as seen in FIG. 5L, the lower pad electrode 401 may be exposed to the outside by removing the passivation layer 165 formed in the pad area PA. Particularly, through such a process, the passivation layer 165 formed on the lower pad electrode 401 may be all removed, and thus, a whole top of the lower pad electrode 401 may be exposed to the outside.

A process of removing the passivation layer 165 may be performed by using a laser patterning process, but is not limited thereto. The laser patterning process is technology that forms a pattern while moving a laser irradiation apparatus 500 to a substrate where a thin layer is deposited.

In another embodiment of the present invention, a process of removing the passivation layer 165 formed in the pad area PA may be performed after the process of forming the bank 220 or a process of forming an encapsulation layer (not shown), and thus, since the lower pad electrode 401 is covered by the passivation layer 165 in a process of pattern-forming the first anode electrode 180 and the first auxiliary electrode 190, the lower pad electrode 401 is prevented from being damaged by an etchant. Also, a predetermined region of the passivation layer 165 may be removed through laser patterning technology, and thus, a separate mask process is not added for exposing the lower pad electrode 401.

According to the embodiments of the present invention, the pad electrode may be formed to cover the top of the signal pad, thereby preventing the signal pad from being corroded. Accordingly, the signal pad may be formed in a two-layer structure which includes the lower signal pad and the upper signal pad vulnerable to corrosion.

Moreover, according to the embodiments of the present invention, the contact hole for externally exposing the pad electrode, the bank, and the first partition wall may be simultaneously formed through a one-time mask process, and thus, the number of mask processes is reduced.

Moreover, according to the embodiments of the present invention, since a process of externally exposing the lower pad electrode is performed after the second anode electrode and the second auxiliary electrode are formed, the lower pad electrode is prevented from being damaged by an etchant in a process of pattern-forming the first anode electrode and the first auxiliary electrode.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display apparatus, comprising:
   a substrate including an active area and a pad area;
   a thin film transistor (TFT) including an active layer, a gate electrode and a source electrode that are disposed in the active area of the substrate;
   an anode electrode disposed on the TFT;
   an organic emission layer disposed on the anode electrode;
   a cathode electrode disposed on the organic emission layer;
   an auxiliary electrode disposed on a same layer on which the anode electrode is disposed, the auxiliary electrode being connected to the cathode electrode;
   a signal pad disposed in the pad area of the substrate and on a first layer on which the gate electrode is disposed;
   a pad electrode disposed in the pad area and connected to the signal pad through a contact hole, the pad electrode having an exposed portion and a covered portion; and
   a passivation layer disposed on the pad electrode, the passivation layer including a contact hole that externally exposes the exposed portion of the pad electrode,
   wherein the pad electrode is further disposed on a second layer on which the source electrode is disposed,
   wherein the pad electrode disposed in the pad area is externally exposed,
   wherein the active layer is interposed between the first layer and the substrate,
   wherein the source electrode is disposed between an interlayer dielectric as the second layer formed adjacent the gate electrode and the passivation layer formed adjacent the source electrode,
   wherein the covered portion of the pad electrode is interposed between the passivation layer and the interlayer dielectric, and
   wherein the gate electrode is disposed between a gate insulation layer as the first layer and the interlayer dielectric as the second layer formed on the gate electrode.

2. The organic light emitting display apparatus of claim 1, wherein the pad electrode is formed of a material having a lower oxidation rate than that of the signal pad.

3. The organic light emitting display apparatus of claim 1, wherein
   the source electrode comprises a lower source electrode and an upper source electrode, and
   the pad electrode is a single layer formed of a same material as that of the lower source electrode.

4. The organic light emitting display apparatus of claim 1, wherein an upper surface of the pad electrode is exposed to an outside.

5. The organic light emitting display apparatus of claim 1, wherein
   the signal pad comprises a lower signal pad and an upper signal pad,
   an oxidation rate of the lower signal pad is lower than an oxidation rate of the upper signal pad, and
   a resistance of the upper signal pad is lower than a resistance of the lower signal pad.

6. The organic light emitting display apparatus of claim 1, wherein the auxiliary electrode comprises:
   a first auxiliary electrode; and
   a second auxiliary electrode disposed on a top and a side surface of the first auxiliary electrode.

7. The organic light emitting display apparatus of claim 6, wherein
   the first auxiliary electrode comprises a first lower auxiliary electrode and a first upper auxiliary electrode, and
   the second auxiliary electrode comprises a second lower auxiliary electrode, a second center auxiliary electrode, and a second upper auxiliary electrode.

8. The organic light emitting display apparatus of claim 7, wherein
   an oxidation rate of the first lower auxiliary electrode is lower than an oxidation rate of the first upper auxiliary electrode, a resistance of the first upper auxiliary electrode is lower than a resistance of the first lower auxiliary electrode, an oxidation rate of each of the second lower auxiliary electrode and the second upper auxiliary electrode is lower than an oxidation rate of the second center auxiliary electrode, and a resistance of the second center auxiliary electrode is lower than a resistance of each of the second lower auxiliary electrode and the second upper auxiliary electrode.

9. The organic light emitting display apparatus of claim 1, further comprising:

a bank disposed on one side and the other side of the auxiliary electrode; and a partition wall disposed on the auxiliary electrode and being separated from the bank, wherein the cathode electrode is connected to the auxiliary electrode through a separation space between the bank and the partition wall.

10. The organic light emitting display apparatus of claim 1, wherein the pad electrode and the source electrode are disposed on the interlayer dielectric as the second layer.

11. The organic light emitting display apparatus of claim 1, wherein the pad electrode is formed to cover the signal pad to prevent the signal pad from being corroded.

12. A method of manufacturing an organic light emitting display apparatus, the method comprising:

forming a gate electrode and a signal pad on a gate insulating layer;

forming an interlayer dielectric on the gate electrode and the signal pad and forming a source electrode and a pad electrode on the interlayer dielectric;

forming a passivation layer on the source electrode and the pad electrode;

forming an anode electrode and an auxiliary electrode separated from the anode electrode on the passivation layer; and removing at least a portion of the passivation layer formed on the pad electrode to define an exposed portion and a covered portion of the pad electrode, and for externally exposing the exposed portion of the pad electrode disposed in a pad area, wherein a substrate has an active layer formed thereon, and an active area and the pad area, wherein the active layer is interposed between the gate insulating layer and the substrate, and wherein the source electrode is disposed between an interlayer dielectric as the second layer formed adjacent the gate electrode and a passivation layer formed adjacent the source electrode, wherein the covered portion of the pad electrode is interposed between the passivation layer and the interlayer dielectric, and wherein the gate electrode is disposed between a gate insulation layer as the first layer and the interlayer dielectric as the second layer formed on the gate electrode.

13. The method of claim 12, further comprising forming a planarization layer between the passivation layer and the anode electrode.

14. The method of claim 12, wherein the forming of the source electrode and the pad electrode comprises:

forming a lower source electrode and an upper source electrode and forming a lower pad electrode and an upper pad electrode by using a photoresist pattern as a mask;

ashing the photoresist pattern to remove the photoresist pattern on the pad electrode; and etching the upper pad electrode.

15. The method of claim 12, wherein the removing of the at least a portion of the passivation layer comprises:

forming a photoresist pattern on the anode electrode, the auxiliary electrode, and the passivation layer;

forming a contact hole for externally exposing the exposed portion of the pad electrode by removing a predetermined region of the passivation layer by using the photoresist pattern as a mask; and after the forming of the contact hole, forming a bank by using the photoresist pattern which is left after ashing the photoresist pattern.

16. The method of claim 12, wherein the forming of the anode electrode comprises forming a first anode electrode and a second anode electrode, and the forming the auxiliary electrode comprises forming a first auxiliary electrode and a second auxiliary electrode, and wherein the second anode electrode covers a top and a side surface of the first anode electrode, and the second auxiliary electrode covers a top and a side surface of the first auxiliary electrode.

17. The method of claim 16, further comprising:

after the forming of the second anode electrode and the second auxiliary electrode and the removing of the at least a portion of the passivation layer, forming a bank on one side and the other side of the second auxiliary electrode;

forming an organic emission layer on the second anode electrode; and forming a cathode electrode, connected to the second auxiliary electrode, on the organic emission layer.

* * * * *